(12) United States Patent
Lin

(10) Patent No.: US 12,308,806 B2
(45) Date of Patent: May 20, 2025

(54) AMPLIFIER CIRCUIT

(71) Applicant: Taiwan Semiconductor Manufacturing Company, Ltd., Hsinchu (TW)

(72) Inventor: Wei Shuo Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/442,176

(22) Filed: Feb. 15, 2024

(65) Prior Publication Data
US 2024/0186967 A1    Jun. 6, 2024

Related U.S. Application Data

(63) Continuation of application No. 18/302,016, filed on Apr. 18, 2023, now Pat. No. 11,949,391, which is a
(Continued)

(51) Int. Cl.
*H03F 3/45*    (2006.01)

(52) U.S. Cl.
CPC ............ *H03F 3/45269* (2013.01); *H03F 2203/45028* (2013.01)

(58) Field of Classification Search
CPC .............. H03F 3/45269; H03F 2203/45028
(Continued)

(56) References Cited

U.S. PATENT DOCUMENTS

| 4,564,879 A | 1/1986 | Bienstma |
| 4,766,394 A * | 8/1988 | Yukawa .............. H03F 3/45708 330/253 |

(Continued)

FOREIGN PATENT DOCUMENTS

| CN | 102194836 A | 9/2011 |
| CN | 106210569 A | 12/2016 |

(Continued)

OTHER PUBLICATIONS

J. Dunsmore, "New modeling results for non-linear differential amplifier behavior, including two-tone TOI response", 2005 European Microwave Conference, DOI: 10.1109/EUMC.2005.1608865, 2005.
(Continued)

*Primary Examiner* — Patricia T Nguyen
(74) *Attorney, Agent, or Firm* — Finnegan, Henderson, Farabow, Garrett & Dunner, L.L.P.

(57) ABSTRACT

A first embodiment is directed to a circuit including a positive biasing circuit with a drive PMOS for biasing in subthreshold, a negative biasing circuit with a drive NMOS for biasing in subthreshold, and an amplification circuit coupled to the biasing circuits. The amplification circuit includes a first stage with a first boosting stage, a second stage with a second boosting stage, and a resistive element coupled between the first and second stages. A second embodiment is directed to a folded cascode operational amplifier wherein a value of the resistive element is selected to place at least one of a drive MOS in subthreshold. A third embodiment is directed to an integrated circuit with a resistive area neighboring a first boosting area and a second boosting area, the resistive area including a resistive element directly connected to a drive PMOS and a drive NMOS.

20 Claims, 11 Drawing Sheets

Related U.S. Application Data continuation of application No. 17/658,822, filed on Apr. 11, 2022, now Pat. No. 11,658,627, which is a continuation of application No. 17/355,491, filed on Jun. 23, 2021, now Pat. No. 11,336,246.

(60) Provisional application No. 63/166,084, filed on Mar. 25, 2021.

(58) Field of Classification Search
USPC .......................................................... 330/253
See application file for complete search history.

(56) References Cited

U.S. PATENT DOCUMENTS

| | | | |
|---|---|---|---|
| 5,075,636 A | 12/1991 | Addis et al. | |
| 6,043,710 A | 3/2000 | Smith et al. | |
| 6,154,069 A | 11/2000 | Ebihara | |
| 6,184,750 B1 * | 2/2001 | Somerville | H03F 1/38 330/268 |
| 6,292,028 B1 * | 9/2001 | Tomita | H04L 25/028 326/86 |
| 6,583,669 B1 | 6/2003 | Eschauzier et al. | |
| 6,684,065 B2 | 1/2004 | Bult et al. | |
| 10,491,167 B1 | 11/2019 | Far | |
| 2002/0005757 A1 | 1/2002 | Colonna et al. | |
| 2003/0184379 A1 | 10/2003 | Ivanov et al. | |
| 2004/0090268 A1 | 5/2004 | Sanchez et al. | |
| 2006/0006928 A1 * | 1/2006 | Utsuno | G09G 3/3688 327/541 |
| 2007/0139116 A1 | 6/2007 | Yang et al. | |
| 2008/0036538 A1 * | 2/2008 | Lee | H03F 3/45219 330/261 |
| 2009/0066416 A1 * | 3/2009 | Adachi | H03F 1/308 330/264 |
| 2009/0082691 A1 | 3/2009 | Denison et al. | |
| 2009/0224343 A1 | 9/2009 | Akram | |
| 2009/0289930 A1 | 11/2009 | Nishimura | |
| 2010/0164607 A1 | 7/2010 | Miyatake et al. | |
| 2011/0156819 A1 | 6/2011 | Kim et al. | |
| 2012/0187512 A1 | 7/2012 | Wang et al. | |
| 2013/0241018 A1 | 9/2013 | JangJian et al. | |
| 2014/0160335 A1 | 6/2014 | Shimotsusa | |
| 2015/0279022 A1 | 10/2015 | Shuster et al. | |
| 2016/0233833 A1 | 8/2016 | Mora-Puchalt | |
| 2020/0050231 A1 | 2/2020 | Nomura et al. | |

FOREIGN PATENT DOCUMENTS

| | | |
|---|---|---|
| CN | 106558478 A | 4/2017 |
| JP | 2009260445 A | 11/2009 |
| KR | 20080004880 A | 1/2008 |
| KR | 20120023578 A | 3/2012 |
| KR | 20150049429 A | 5/2015 |
| KR | 20160005431 A | 1/2016 |
| KR | 20160071008 A | 6/2016 |

OTHER PUBLICATIONS

Bedrich J. Hosticka, "Improvement of the Gain of MOS amplifiers", IEEE Journal of Solid-State Circuits, vol. SC-14, No. 6, Dec. 1979, pp. 1111-1114.

Rohana Musa et al., Design of Single-Stage Folded-Cascode Gain Boost Amplifier for 100mW, 10-bit 50MS/s Pipelined Analog-to-Digital Converter, IEEE, AMS IC Design Group, Microsystems, MIMOS Berhad.

Eduard Sackinger et al., "A High-Swing, High-Impedance MOS Cascode Circuit", IEEE Journal of Solid State Circuits, vol. 25, No. 1, Feb. 1990, pp. 289-298.

B.G. Song et al., "A 1.8V Self-Biased Complementary Folded Cascode Amplifier", ANAM Semiconductor Inc., Dept. of Electronic Engineering, Hanyang University, Seoul, Korea.

Gav, Sai Praneeth, and Anil Kumar Saini. "A self biased operational amplifier at ultra low power supply voltage." 2009 16th IEEE International Conference on Electronics, Circuits and Systems—(ICECS 2009). IEEE, 2009.

* cited by examiner

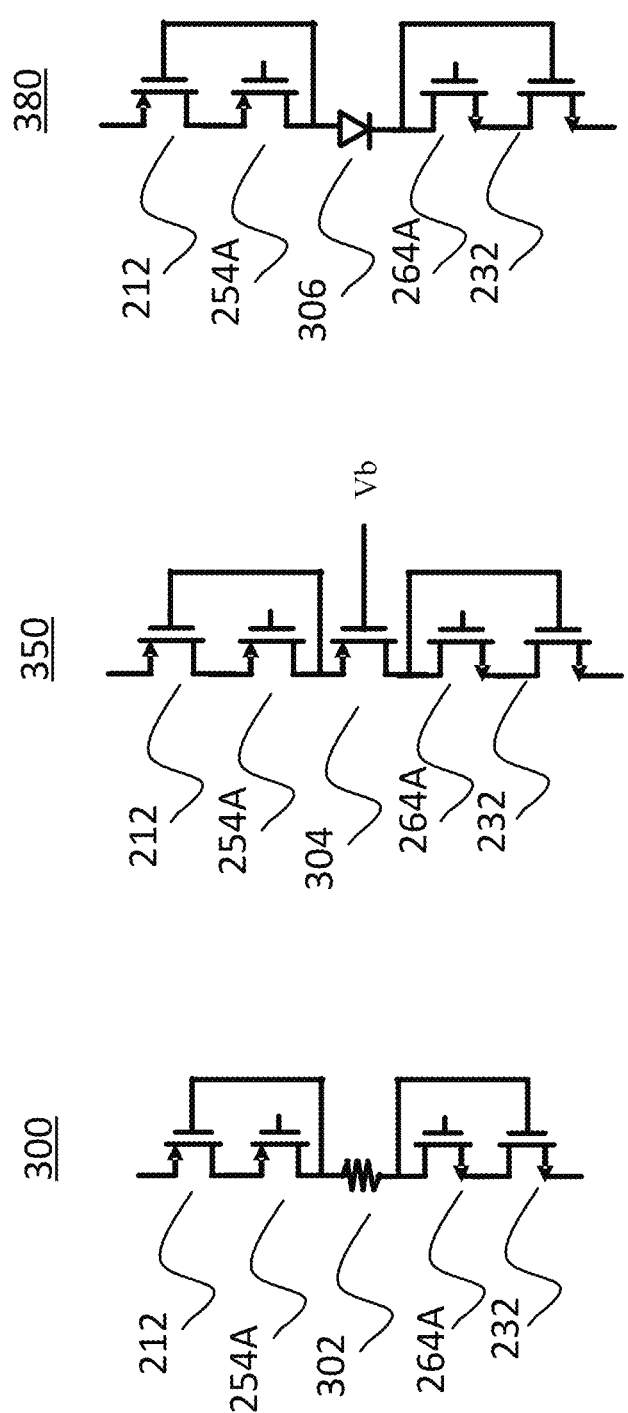

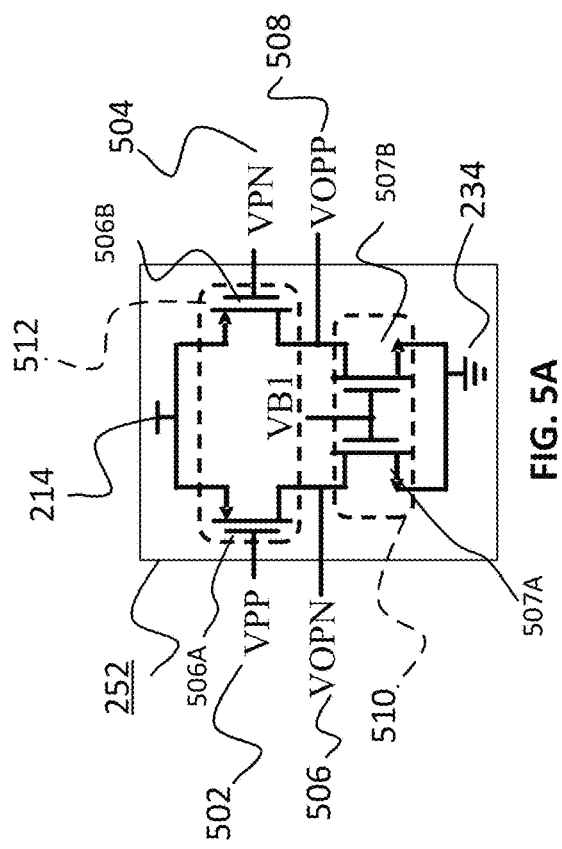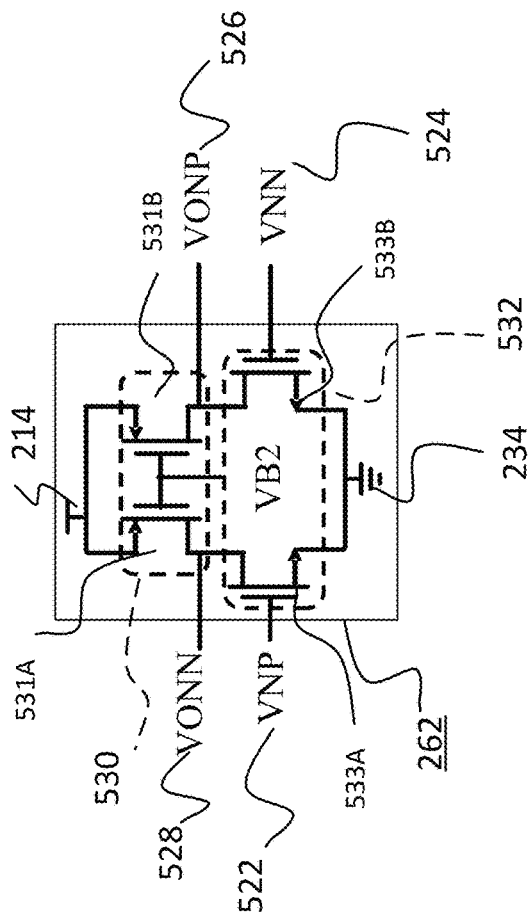
FIG. 5A
FIG. 5B

AMPLIFIER CIRCUIT

CROSS-REFERENCE TO RELATED APPLICATIONS

This application is a continuation of and claims the benefit of priority to U.S. application Ser. No. 18/302,016, filed Apr. 18, 2023 (now U.S. Pat. No. 11,949,391), which claims the benefit of priority to U.S. application Ser. No. 17/658,822 filed Apr. 11, 2022 (now U.S. Pat. No. 11,658,627), which claims the benefit of priority to U.S. application Ser. No. 17/355,491, filed Jun. 23, 2021 (now U.S. Pat. No. 11,336, 246), which claims the benefit of priority under 35 U.S.C. 119(e) to U.S. provisional application No. 63/166,084, filed Mar. 25, 2021. The disclosures of the above-referenced applications are expressly incorporated herein by reference in their entireties.

TECHNICAL FIELD

The disclosure relates to an amplifier circuit and an integrated circuit implementing the amplifier circuit.

BACKGROUND

Operational amplifiers are high-gain electronic voltage amplifying circuits with a differential input and one or more outputs. The operational amplifiers produce an output potential that is typically thousands of times larger than a potential difference between its input terminals. Operational amplifiers may be used in different amplification modes including, but not limited to, linear amplification, non-linear amplification, and/or frequency-dependent amplification. Further, operational amplifiers are used in both analog and digital circuits as a building block for multiple applications. And, because operational amplifiers can be adjusted with external components for specific operations, operational amplifiers are highly adaptable for customized operations. For example, the gain, input, output, impedance, and bandwidth of an operational amplifier can be customized with external components.

Operational amplifiers may be implemented in integrated circuits with specific configurations of active and/or passive electronic devices. For example, operational amplifiers may be fabricated within integrated circuits using networks of transistors configured for high-gain transduction. Such operational amplifiers may be used for on-chip amplification of weak signals, noise reduction, and other signal processing operations. For example, operational amplifiers in integrated circuits can be used to filter and amplify signals inputted in processing and/or logic circuits within the integrated circuit. Operational amplifiers in integrated circuits may use BJT and/or CMOS technology, and may employ cascading configurations to adjust gains, operative frequency, and signal phasing.

The disclosed systems, apparatus, and methods for operational amplifiers and integrated circuits are directed to addressing one or more problems or challenges in the prior art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A shows a circuit diagram of an exemplary configuration of drive transistors using a resistor in accordance with some embodiments of the present disclosure.

FIG. 3B shows a circuit diagram of an exemplary configuration of drive transistors using a transistor in accordance with some embodiments of the present disclosure.

FIG. 3C shows a circuit diagram of an exemplary configuration of drive transistors using a diode in accordance with some embodiments of the present disclosure.

FIG. 5A shows a circuit diagram of a first exemplary boosting stage in accordance with some embodiments of the present disclosure.

FIG. 5B shows a circuit diagram of a second exemplary boosting stage in accordance with some embodiments of the present disclosure.

DETAILED DESCRIPTION

Figure 1:
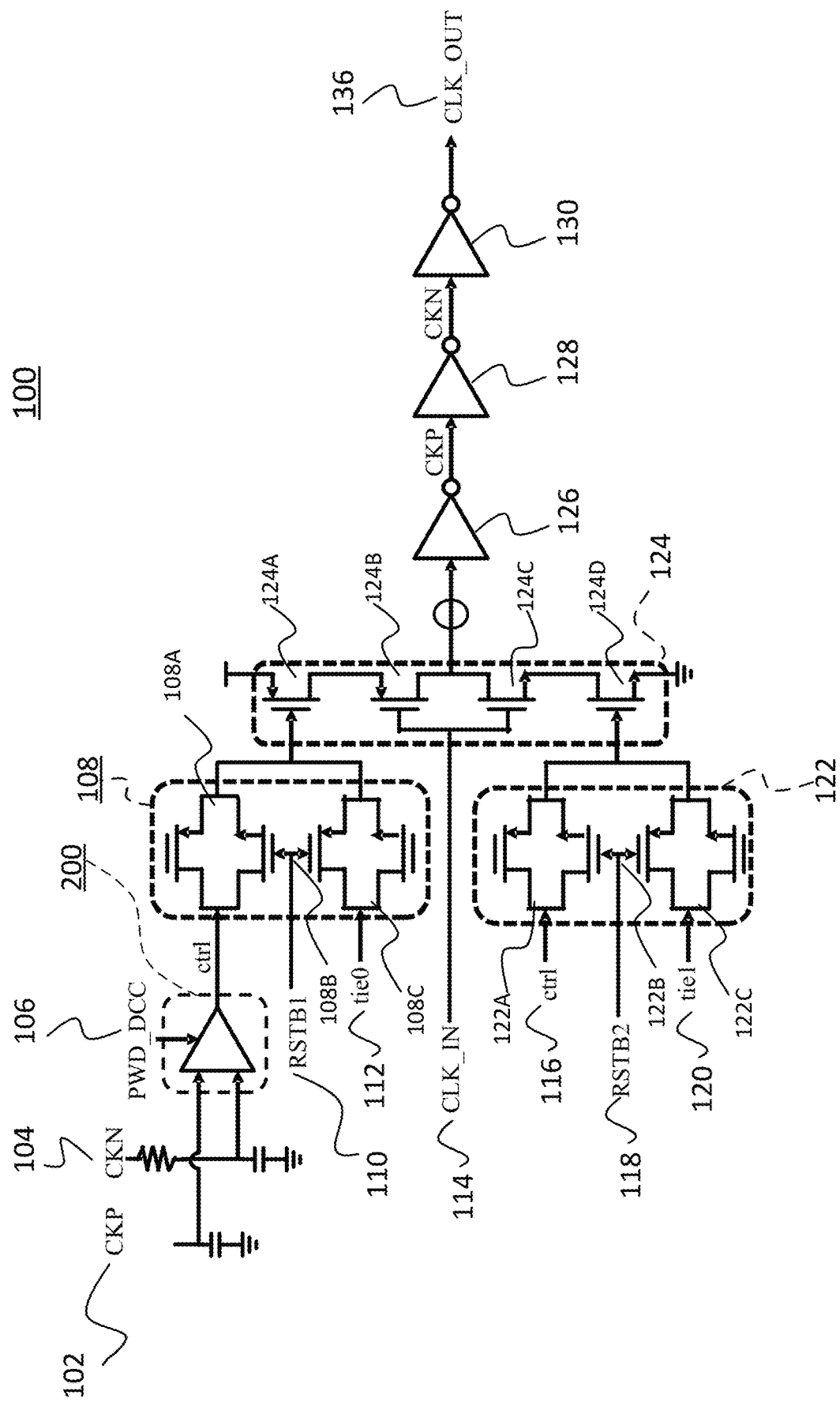
FIG. 1 shows a circuit diagram of a duty cycle corrector (DCC) with synchronous input clock in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, connectivity terms such as "connected," "coupled," "joined," "attached," and the like, may be used herein for ease of description to describe elements that have an electrical, electromagnetic, radio frequency, or ultrasonic connectivity. Moreover, connectivity terms may denote general electrical or magnetic communication between components. These connectivity terms may denote a direct connection (i.e., two components being connected without any intervening element) or an indirect connection (i.e., two components being connected through one or more intervening elements).

FIG. 1 shows a circuit diagram of a duty cycle corrector (DCC) 100 with synchronous input clock in accordance with some embodiments of the present disclosure. In some embodiments, DCC 100 may be configured to adjust a clock duty cycle to a selected percentage. For example, DCC 100 may be configured to adjust the clock duty cycle to modify clock signals for a double date rate (DDR), a half-rate clock data recovery (CDR), and/or a delay locked loop (DLL). In some embodiments, DCC 100 may be used in applications using mutli-phase clocks, MUX/DEMUX circuits, or other circuits with fixed rising edge requirements. DCC 100 may be used for analog, semi-digital, and/or digital applications.

DCC 100 includes a clock input CLK_IN 114 which can be connected to an external input circuit transmitting an input signal to be modified and/or corrected. DCC 100 also includes differential inputs of a signal CKP 102 and a signal CKN 104. In some embodiments, as shown in FIG. 1, signal CKP 102 and signal CKN 104 are generated by operational amplifiers in DCC 100. In such embodiments, as further discussed below, CKP 102 is generated by an inverter 126 and CKN 104 is generated by an inverter 128. And CKP 102 and CKN 104 can be used as feedback signals. Thus, as shown in FIG. 1, inputs CKP 102 and CKN 104 are connected to an amplifier 200 which is connected to a power node PWD_DCC 106. Amplifier 200 is further discussed in connection with FIG. 2.

As shown in FIG. 1, an output of amplifier 200 is coupled to a first control stage 108. The first control stage 108 includes first coupled CMOS transistors 108A, second coupled CMOS transistors 108C, and a first connection node 108B. First coupled CMOS transistors 108A are connected to the amplifier 200 output, first connection node 108B is connected to a first reset control signal RSTB1 110, and second coupled CMOS transistors 108C are connected to a first tie control signal tie0 112. As shown in FIG. 1, while the output of amplifier 200 and an input of signal tie0 112 are connected to drain/source of First coupled CMOS transistors 108A and second coupled CMOS transistors 108C, signal RSTB1 110 is coupled to first connection node 108B. Further, first coupled CMOS transistors 108A, second coupled CMOS transistors 108C may be coupled together through their respective gates.

DCC 100 includes a second control stage 122 with a configuration similar to the one described above for first control stage 108. In some embodiments, as shown in FIG. 1, the second control stage 122 includes third coupled CMOS transistors 122A, fourth coupled CMOS transistors 122C, and a second connection node 122B. Third coupled CMOS transistors 122A are coupled with a control node 116. Although not shown, control node 116 may be coupled to an output of another amplifier, similar to amplifier 200. In other embodiments, however, control node 116 may be connected to another circuit and/or electronic device. Second connection node 122B is coupled to a second reset control signal RSTB2 118 and fourth coupled CMOS transistors 122C are coupled to receive a second tie control signal tie1 120. Similar to the connections in the first control stage 108, the control node 116 and an input for signal tie1 120 are connected to drain source nodes of third coupled CMOS transistors 122A, fourth coupled CMOS transistors 122C while signal RSTB2 118 is connected to second connection node 122B.

DCC 100 also includes a correction stage 124 that is coupled to the first control stage 108, second control stage 122, and an input of signal CLK_IN 114. Correction stage 124 includes a first PMOS transistor 124A, a second PMOS transistor 124B, a first NMOS transistor 124C, and a second NMOS transistors 124D. As shown in FIG. 1, transistors 124A-124D are coupled in series. Also as shown in FIG. 1, first PMOS transistor 124A is coupled to a power node, which in some embodiments may be the same node as PWD_DCC 106. And second NMOS transistors 124D is connected to a ground node. The gate of first PMOS transistor 124A is coupled to drain/sources of first coupled CMOS transistors 108A and second coupled CMOS transistors 108C. The gate of first NMOS transistor 124C is coupled to drain sources of third coupled CMOS transistors 122A and fourth coupled CMOS transistors 122C. Further, the gates of second PMOS transistor 124B and first NMOS transistor 124C are shorted, as shown in FIG. 1, and the shorted gates are coupled to receive signal CLK_IN 114. As shown in FIG. 1, second PMOS transistor 124B and first NMOS transistor 124C provide an output of correction stage 124. For example, drain/source nodes of second PMOS transistor 124B and first NMOS transistor 124C provide an output of the correction stage 124. This configuration of correction stage 124 may operate as a buffer and/or charge pump to modify the CLK_IN 114 signal. Correction stage 124 may also be configured to be an integrator and/or modifier of CLK_IN 114.

An output of correction stage 124 is coupled to a series of inverters that result in an output signal CLK_OUT 136. For example, as shown in FIG. 1 the output of correction stage 124 (drain/source nodes of transistors with shorted gates) is connected to a first inverter 126. The output of first inverter 126 may provide a differential output. In some embodiments, the output of first inverter 126 may be used as feedback by being routed to CKP 102. First inverter 126 is connected in series with a second inverter 128. The output of second inverter 128 may also be used as feedback in series with routed to CKN 104.

DCC 100 also includes a third inverter 130 connected in series with second inverter 128. But unlike first inverter 126 and second inverter 128, the output of third inverter 130 is the output of DCC 100.

In some embodiments, inverters 126, 128, and 130 may be configured to also provide gain and/or attenuation. Further, in some embodiments, inverters 126, 128, and 130 may be implemented with amplifiers similar to amplifier 200, which is further discussed in connection with FIG. 2.

Figure 2:
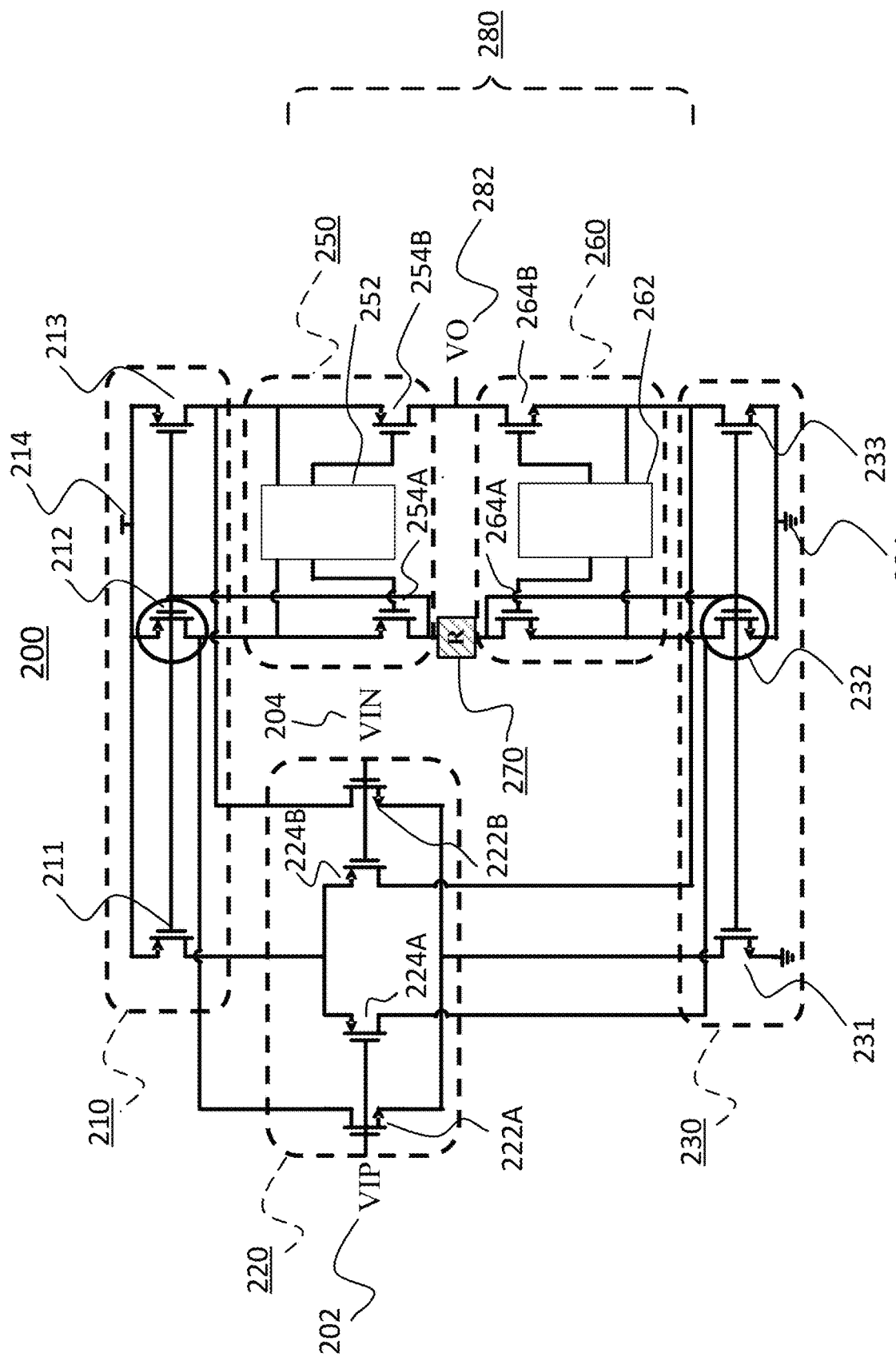
FIG. 2 shows a circuit diagram of an exemplary operational amplifier in accordance with some embodiments of the present disclosure.

FIG. 2 shows a circuit diagram of an exemplary implementation of amplifier 200 in accordance with some embodiments of the present disclosure. As discussed in connection with FIG. 1, in some embodiments amplifier 200 is part of DCC 100. For example, amplifier 200 can be used to receive differential clock signals for duty cycle modifications and/or corrections. However, amplifier 200 may be employed in other applications unrelated to DCC 100. For example, amplifier 200 may be employed as a differential amplifier, as an inverter amplifier (such as first inverter 126 in FIG. 1), and as a non-inverter amplifier. In some embodiments, as shown in FIG. 2, amplifier 200 is configured as a folded cascode amplifier. But in other embodiments, elements of amplifier 200 may be reconfigured to have non-folded cascode configurations.

Amplifier 200 includes a positive biasing circuit 210 and a negative biasing circuit 230. Amplifier 200 also includes a differential input circuit 220. Amplifier 200 further includes a first stage 250 and second stage 260, which jointly create an amplification circuit 280 that provides the differential amplification in amplifier 200.

Positive biasing circuit 210 may provide voltages and/or currents for the operation of amplifier 200. As shown in FIG. 2, positive biasing circuit 210 includes a plurality of PMOS transistors. In other embodiments, however, positive biasing circuit 210 may have alternative transistors, such as BJT transistors and/or NMOS transistors.

The transistors in positive biasing circuit 210 include a first bias PMOS transistor 211, a second bias PMOS transistor 213, and a drive PMOS transistor 212. As further discussed below in connection with FIGS. 3A, 3B, and 7, drive PMOS transistor 212 may be configured to be biased in a subthreshold region. A PMOS transistor 212 threshold voltage of drive PMOS transistor 212 may be determined by MOSFET threshold voltage equations such as $V_t = V_{FB} + 2\phi_f + \sqrt{2\varepsilon_s q N_{60}(2\phi_f + V_{SB})}/C_{ox}$ where $V_t$ is the threshold voltage, $V_{FB}$ is the transistor flat band voltage, $\phi_f$ is the surface potential, $\varepsilon_s$ is the relative permittivity, q is elementary charge, $N_a$ is the doping concentration, $V_{SB}$ is the source-to-body substrate bias, and $C_{ox}$ is the effective capacitance. The dimensions, doping characteristics, and processing of drive PMOS transistor 212 may be selected to have drive PMOS transistor 212 operate in a subthreshold region when amplifier 200 is turned on. In some embodiments, for example, the W/D, $C_{ox}$, doping, and $V_{FB}$, in PMOS transistor 212 are selected for subthreshold operation in amplifier 200.

As shown in FIG. 2, the gates of first bias PMOS transistor 211, second bias PMOS transistor 213, and drive PMOS transistor 212 are directly connected. Further, first bias PMOS transistor 211, second bias PMOS transistor 213, and drive PMOS transistor 212 in positive biasing circuit 210 are connected to a power node 214 which provides a voltage and/or current supply. For example, in some embodiments power node 214 may be the same node as PWD_DCC 106 (FIG. 1). First bias PMOS transistor 211, second bias PMOS transistor 213, and drive PMOS transistor 212 in positive biasing circuit 210 are also connected to other stages or devices in amplifier 200. For example, first bias PMOS transistor 211 and drive PMOS transistor 212 may be connected to differential input circuit 220 and first stage 250.

FIG. 2 shows an embodiment of positive biasing circuit 210 with three PMOS transistors. Other embodiments, not shown, may use alternative configurations of transistors in positive biasing circuit 210. For example, positive biasing circuit 210 may include four or more transistors which may include both CMOS or BJT transistors. Alternatively, or additionally, positive biasing circuit 210 may include alternative three-terminal devices such as vacuum tubes or other semiconductor devices.

Similar to positive biasing circuit 210, negative biasing circuit 230 includes transistors directly connected to differential input circuit 220. But instead of being connected to first stage 250, transistors in negative biasing circuit 230 are also connected to second stage 260. Further, transistors in negative biasing circuit 230 include a plurality of NMOS transistors. In other embodiments, however, negative biasing circuit 230 may have alternative transistors. For example, negative biasing circuit 230 may include four or more transistors which may include both CMOS and BJT transistors. Alternatively, or additionally, negative biasing circuit 230 may alternatively include three-terminal devices such as vacuum tubes or other semiconductor devices.

The transistors in negative biasing circuit 230 include a drive NMOS transistor 232, a first biasing NMOS transistor 231, and a second biasing NMOS transistor 233. Similar to drive PMOS transistor 212, drive NMOS transistor 232 may be configurable to be biased in the subthreshold region. For example, dimensions, oxide, doping, and biasing circuitry of drive NMOS transistor 232 may be selected for biasing in the subthreshold region when amplifier 200 is turned on or operated. In some embodiments, for example, the W/D, $C_{ox}$, doping, and $V_{FB}$, in NMOS transistor 232 are selected for subthreshold operation in amplifier 200.

As shown in FIG. 2, the gates of drive NMOS transistor 232, first biasing NMOS transistor 231, and second biasing NMOS transistor 233, have shorted gates. Further, transistors in negative biasing circuit 230 are connected to a ground node 234. In some embodiments ground node 234 may be the same node as ground nodes in DCC 100. Drive NMOS transistor 232, first biasing NMOS transistor 231, and second biasing NMOS transistor 233 are also connected to other stages or transistors in amplifier 200. For example, some of the transistors of negative biasing circuit 230 may be connected to differential input circuit 220 and second stage 260.

Differential input circuit 220 includes a plurality of transistors that are connected to one of first amplifier input VIP 202 or second amplifier input VIN 204. In some embodiments, VIP 202 and VIN 204 may be connected to external elements. For example, VIP 202 and VIN 204 may be coupled to capacitors and/or resistors and receive input signals. In some embodiments, as shown in FIG. 1, inputs of amplifier 200 VIP 202 and VIN 204 receive signals CKP 102 and CKN 104, respectively.

As shown in FIG. 2, the transistors in differential input circuit 220 include both NMOS and PMOS transistors. For example, differential input circuit 220 includes NMOS transistors 222A and 222B and PMOS transistors 224A and 224B. NMOS transistors 222A and 222B may be matching transistors. That is, NMOS transistors 222A and 222B may have the same dimensions, $C_{ox}$, doping, and biasing circuitry. Further, NMOS transistors 222A and 222B may be configured to operate in the same biasing region and under similar voltage and current conditions. In other embodiments, however, NMOS transistors 222A and 222B may be independent and be configured with different W/Ds or different biasing circuitry configurations.

Like the NMOS portion of differential input circuit 220, PMOS transistors 224A and 224B may also be matching transistors. For example, PMOS transistors 224A and 224B may have the same dimensions, $C_{ox}$, doping, and biasing circuitry. And PMOS transistors 224A and 224B may be configured to operate in the same biasing or similar biasing regions. In other embodiments, however, PMOS transistors 224A and 224B may be independent and be configured with different W/Ds or different biasing circuitry configurations.

As shown in FIG. 2, the gate of each of NMOS transistor 222A and PMOS transistor 224A is coupled to VIP 202. In contrast, the gate of each of NMOS transistor 222B and PMOS transistor 224B is coupled to VIN 204. The resulting differential input configuration enables reception of a differential signal to be amplified. For example, in some embodiments VIP 202 and VIN 204 may respectively correspond to CKP 102 and CKN 104 from DCC 100 (FIG. 1). In such embodiments, differential input circuit 220 may interface to the inputs and/or feedback in DCC 100.

Moreover, the drain/source of transistors in differential input circuit 220 are directly connected to other elements of amplifier 200. For example, NMOS transistor 222A is directly connected to drive PMOS transistor 212 and NMOS transistor 222B. In turn NMOS transistor 222B is directly connected to a PMOS in positive biasing circuit 210. PMOS transistors 224A and 224B are both directly connected to first biasing PMOS transistor 211 in positive biasing circuit 210 while PMOS transistors 224A is directly connected to drive NMOS transistor 232 and first biasing NMOS transistor 231 in negative biasing circuit 230.

FIG. 2 shows a configuration of differential input circuit 220 with two NMOS and two PMOS transistors. But other configurations are possible for differential input circuit 220. For example, differential input circuit 220 may be implemented with BJT transistors. Alternatively, or additionally, differential input circuit 220 may be implemented with other three-terminal devices. Moreover, instead of four transistors, differential input circuit 220 may have different arrangements that include more transistors, unpaired transistors, and/or a mix of transistor types. Further, differential input circuit 220 may connect to other elements in amplifier 200 to enable capturing a differential input to be amplified. For example, as shown in FIG. 2, differential input circuit 220 is coupled to positive biasing circuit 210 and negative biasing circuit 230.

First stage 250 is coupled to positive biasing circuit 210 and second stage 260 through a resistive element 270. First stage 250 includes PMOS transistors 254, which include a first PMOS transistor 254A and a second PMOS transistor 254B. In some embodiments, first PMOS transistor 254A and second PMOS transistor 254B are matching transistors with the same dimensions, $C_{ox}$, doping, and biasing circuitry. In other embodiments, first PMOS transistor 254A and second PMOS transistor 254B are independent transistors. First stage 250 also includes a first boosting stage 252. As shown in FIG. 2, first boosting stage 252 is connected to the gates of PMOS transistors 254. Further, drain/source nodes of PMOS transistor 254A are connected in series with drive PMOS transistor 212 and to the gate of drive PMOS transistor 212. PMOS transistor 254B is directly connected between a drain/source of NMOS transistor 222B, which is coupled to VIN 204, and an output node 282 of amplifier 200.

In addition to being connected to PMOS transistors 254, first boosting stage 252 may also be directly connected to transistors in positive biasing circuit 210. For example, first boosting stage 252 is also connected to a drain/source of drive PMOS transistor 212 and to a drain/source of a second biasing PMOS transistor 213 in positive biasing circuit 210. Further, first boosting stage 252 can be directly connected to respective gates of first PMOS transistor 254A and second PMOS transistor 254B.

Second stage 260 has a configuration similar to that of first stage 250. But instead of being coupled to positive biasing circuit 210, second stage 260 is coupled to negative biasing circuit 230. Further, instead of having PMOS transistors 254, second stage 260 has NMOS transistors 264. Second stage 260 includes NMOS transistors 264, which include a first NMOS transistor 264A and a second NMOS transistor 264B. Second stage 260 also includes a second boosting stage 262. Similar to first boosting stage 252, second boosting stage 262 may be connected to the gates of NMOS transistors 264. Further, the drain/source of NMOS transistor 264A is connected in series with drive NMOS transistor 232 and the gate of drive NMOS transistor 232. NMOS transistor 264B is directly connected to a drain/source of second biasing NMOS transistor 233 in negative biasing circuit 230 and to PMOS transistor 254B. The shared node between PMOS transistor 254B and NMOS transistor 264B creates output node 282.

In addition to being connected to NMOS transistors 264, second boosting stage 262 is also directly connected to transistors in negative biasing circuit 230. Second boosting stage 262 is also connected to a drain/source of drive NMOS transistor 232 and to a drain/source of second biasing NMOS transistor 233 in negative biasing circuit 230.

As shown in FIG. 2, first stage 250 connects to second stage 260 via resistive element 270. In particular, a drain/source of PMOS transistor 254A is directly connected to resistive element 270 which is connected to a drain source of NMOS transistor 264A. Further, resistive element 270 is also connected to gates of drive PMOS transistor 212 and drive NMOS transistor 232. Specifically, as shown in FIG. 2, resistive element 270 connects to PMOS transistor 254A and to the gate of drive PMOS transistor 212 at the same node. Thus, a gate of drive PMOS transistor 212 is directly connected to a first terminal of resistive element 270. In particular, in some embodiments a gate of drive NMOS transistor 232 is directly connected to a second terminal of resistive element 270. And resistive element 270 connects to NMOS transistor 264A and to the gate of drive NMOS transistor 232 at the same node, which is different from the node connecting to drive PMOS transistor 212.

Resistive element 270 is shown in FIG. 2 as a two-terminal element, which may include a resistor, capacitor, or inductor (or any combination thereof). But in some embodiments, resistive element 270 may comprise a different type of device. For example, resistive element 270 may include a three-terminal device, such as a transistor or a controlled diode. For example, resistive element 270 may include a transistor biased in a triode mode. In such embodiments, resistive element 270 may be coupled to receive a control signal that allows the selection of a specific resistance desired for operation of amplifier 200. For example, in certain embodiments resistive element 270 may be dynamically configured based on the operation of other elements in amplifier 200. Further, in some embodiments, as further discussed in connection with FIG. 4B, resistive element 270 includes: a PMOS transistor, a resistor, and an NMOS transistor, wherein the PMOS transistor is connected to the resistor in series and the resistor is connected in series with the NMOS transistor.

The inclusion of resistive element 270 shown in FIG. 2 enables configuring amplifier 200 for a self-biased gain-boosted operation. For example, resistive element 270 may be selected to place each of drive PMOS transistor 212 and drive NMOS transistor 232 in subthreshold region operation. Thus, in certain embodiments a value of the resistive element 270 may be selected to set a gate voltage of drive NMOS transistor 232 for operation in the subthreshold region and to set a gate voltage of drive PMOS transistor 212 for operation in the subthreshold region. By properly selecting transistors in amplifier 200, and the value of resistive element 270, one or more of the transistors in amplifier 200 can operate in the subthreshold region. This configuration results in several advantages for amplifier 200. For example, by operating in the subthreshold region amplifier 200 requires a lower power voltage (or Vdd) compared to other amplifiers. Also, by operating in the subthreshold region amplifier 200 achieves a higher DC gain compared to other amplifiers. In particular, the use of gain-boosted stages in amplifier 200 enable a DC gain higher than those of other amplifiers.

In addition to an increased DC gain, amplifier 200 (as shown in FIG. 2) provides other operational advantages. For example, when compared with other folded cascode amplifiers, amplifier 200 reduces the number of external biasing voltages. Folded cascode configurations require a large number of external bias voltages. This requirement results in several constraints, particularly when the amplifier is fabricated in an integrated circuit. For example, having multiple biasing voltages results in area and power overhead, and susceptibility of cross-talk between biasing lines and/or noise. And given the relationship between amplifier gain and sensitivity to noise, the gain of other folded cascode amplifiers is limited by practical considerations of signal-to-noise ratios (SNRs). The configuration of amplifier 200 addresses these issues by providing a low voltage (e.g., less than 2.5V), self-biased, and gain-boosted amplifier. The use of resistive element 270 between first stage 250 and second stage 260 (each with its respective boosting stage), enables the operation of transistors in the subthreshold region, improving the amplifier gain and reducing the number of external biasing lines, which translates into a smaller footprint, less noise, and lower power consumption.

Moreover, the detailed configuration of amplifier 200 may also modify the gain spectrum as compared with other operational amplifiers. By having resistive element 270 placing drive NMOS transistor 232 and drive PMOS transistor 212 in the subthreshold region, it is possible to improve the dynamic range of amplifier 200, allowing it to have strong gains at both low and high input or output voltages. For example, the configuration shown in amplifier 200 results in greater gains at low input voltages (e.g., input voltages of less than 100 mV), but also have high gains for high input voltages (e.g., above 500 mV).

In addition to improvements in operational performance, the configuration of amplifier 200 also improves requirements for fabrication. For example, as further discussed in connection to FIGS. 9A and 9B, the configuration of circuits and stages shown in FIG. 2 allows the configuration of specific areas with smaller footprint, simpler wiring, and lower power consumption. Further, the design of amplifier 200 is versatile and can be used in multiple technology nodes. For example, amplifier 200 may be implemented in various manufacturing processes including 3 nm, 5 nm, 7 nm, 10 nm, 16 nm, and 20 nm processes.

The operational and manufacturing advantages provided by amplifier 200 makes it a good candidate for an operational amplifier in digital and/or analog circuits. For example, amplifier 200 may improve the operation and/or facilitate the fabrication of DCC 100.

FIG. 3A shows a circuit diagram of an exemplary configuration 300 of drive transistors implementing a resistor as resistive element 270, in accordance with some embodiments of the present disclosure. In configuration 300, resistive element 270 is implemented as a resistor 302. As shown in FIG. 3A, employing resistor 302 as the resistive element creates a branch of amplification circuit 280 (FIG. 2) in which the gate of drive PMOS transistor 212 is coupled to one end of resistor 302 while the gate of drive NMOS transistor 232 is coupled to the other end of resistor 302. Further, resistor 302 is also connected to transistors of first stage 250 and second stage 260. Particularly, one end of resistor 302 is coupled to PMOS transistor 254A and the other end of resistor 302 is coupled to NMOS transistor 264A.

Configuration 300, using resistor 302, effectively decreases the gate-to-source voltages of drive NMOS transistor 232 and drive PMOS transistor 212 so that both can operate in the subthreshold region. That is, the incorporation of resistor 302 in a branch of amplification circuit 280 results in lower gate-source voltages in drive transistors, such lower voltages facilitating operation in subthreshold and permit self-biasing. Thus, adequately selecting the value of resistor 302 may result in the advantages of amplifier 200 as described above.

FIG. 3B shows a circuit diagram of an exemplary configuration 350 of drive transistors implementing a transistor as resistive element 270, in accordance with some embodiments of the present disclosure. In configuration 350, resistive element 270 is implemented as a transistor 304. As shown in FIG. 3B, in some embodiments transistor 304 is a PMOS device. In other embodiments, however, transistor 304 may be an NMOS device or a BJT device. Transistor 304 may be used as a controlled variable resistor. For example, Vb applied to the gate of transistor 304 may be selected to place transistor 304 in a resistive or triode operation mode. The equivalent resistance may be selected to place drive PMOS transistor 212 and drive NMOS transistor 232 in the subthreshold region. Using transistor 304 as the resistive element creates a branch of amplification circuit 280 (FIG. 2) in which the gate of drive PMOS transistor 212 is coupled to the source of transistor 304 while the gate of drive NMOS transistor 232 is coupled to the drain transistor 304. Further, transistor 304 is also connected to transistors of first stage 250 and second stage 260. Particularly, the source of transistor 304 is coupled to PMOS transistor 254A and the drain of transistor 304 is coupled to NMOS transistor 264A.

In configuration 350 the biasing condition of transistor 304 may be selected to decrease the gate-to-source voltages of drive NMOS transistor 232 and drive PMOS transistor 212 so that both of them can operate in the subthreshold region. That is, the incorporation of transistor 304 with Vb applied for triode operation results in adjusted gate-source voltages in drive transistors, which facilitate operation in subthreshold and permit self-biasing. Thus, appropriately selecting the value and biasing of transistor 304 results in the advantages of amplifier 200 as described above.

FIG. 3C shows a circuit diagram of an exemplary configuration 380 of drive transistors implementing a diode as resistive element 270, in accordance with some embodiments of the present disclosure. In configuration 380, resistive element 270 is implemented as a diode 306. Diode 306 may be a standard diode connected for forward biasing and a selected diode voltage drop required for resistive operation. In other embodiments, however, diode 306 may be configured for reverse bias and the breakdown voltage may be selected for an equivalent resistance. In some embodiments, diode 306 may be implemented with Zener and/or Schottky diodes. The equivalent resistance of diode 306 may be selected to place drive PMOS transistor 212 and drive NMOS transistor 232 in the subthreshold region. Using diode 306 as a resistive element creates a branch of amplification circuit 280 (FIG. 2) in which the gate of drive PMOS transistor 212 is coupled to one end of diode 306 while the gate of drive NMOS transistor 232 is coupled to the other end of diode 306. Further, diode 306 is also connected to transistors of first stage 250 and second stage 260. Particularly, one end of diode 306 is coupled to PMOS transistor 254A and another end of diode 306 is coupled to NMOS transistor 264A.

In configuration 380 the biasing condition of diode 306 may be selected to decrease the gate-to-source voltages of drive NMOS transistor 232 and drive PMOS transistor 212 so that both of them can operate in the subthreshold region. That is, the incorporation of diode 306, with adequately selected equivalent resistance (either in forward or reverse modes) results in adjusted gate-to-source voltages in drive transistors, which facilitate operation in subthreshold and permit self-biasing. Thus, appropriately selecting the parameters of diode 306 may result in the advantages of amplifier 200 as described above.

Figure 4A:
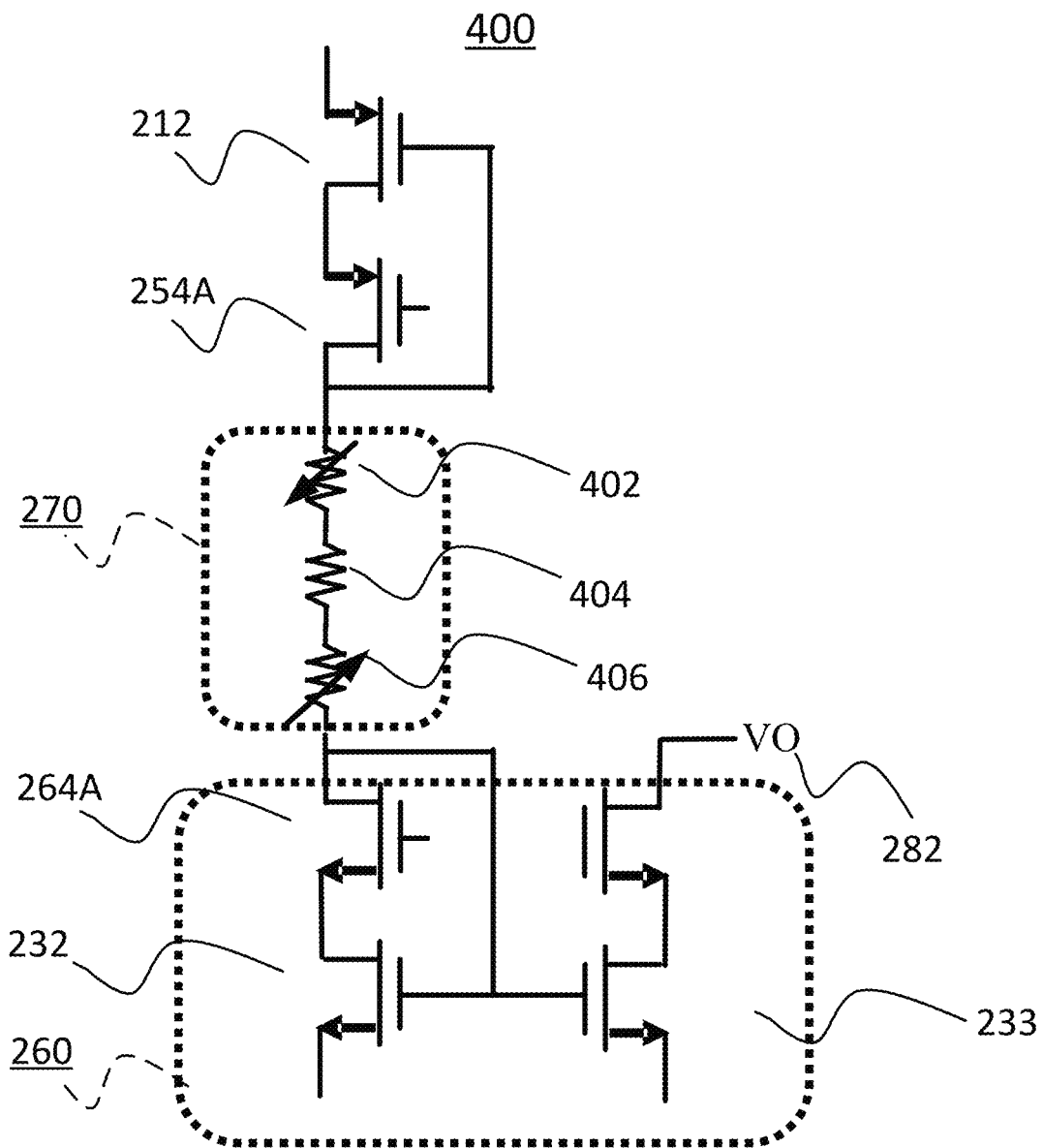
FIG. 4A shows a circuit diagram of an exemplary configuration of an operational amplifier using variable resistors in accordance with some embodiments of the present disclosure.

FIG. 4A shows a circuit diagram of an exemplary configuration 400 of a portion of amplifier 200 using variable resistors, in accordance with some embodiments of the present disclosure. In configuration 400, resistive element 270 is implemented with a series of variable and fixed resistors. Such configuration may facilitate selection of adequate resistive values that result in subthreshold biasing of drive PMOS transistor 212 and drive NMOS transistor 232.

In configuration 400, resistive element 270 is implemented with a first variable resistor 402, a fixed resistor 404, and a second variable resistor 406. This configuration allows to both increase and decrease of gate-to-source voltages (Vgs) of drive PMOS transistor 212 and drive NMOS transistor 232 resulting in a more accurate control of gain and power consumption by precisely selecting the operation modes of drive transistors. Further, use of variable resistors as part of resistive element 270 enables increasing amplifier 200 output and common mode range.

The ability to accurately control the gate-to-source voltage of drive PMOS transistor 212 and drive NMOS transistor 232 allows the selection of Vgs based on the output voltage (VO) at output node 282. To place drive PMOS transistor 212 and drive NMOS transistor 232 in the subthreshold region, configuration 400 allows adjusting Vgs based on VO. For example, as further discussed in connection with FIG. 4B, a signal from VO may be employed as feedback control to dynamically adjust the value of first variable resistor 402 and second variable resistor 406. In this way, as VO at output node 282 increases, first variable resistor 402 and second variable resistor 406 may be modified to increase Vgs, avoid saturation, or triode operation, and maintain the transistor in the subthreshold region. Inversely, as VO decreases, first variable resistor 402 and second variable resistor 406 may be adjusted to decrease Vgs to avoid saturation or triode operation and keep the device in the subthreshold region.

In some embodiments, first variable resistor 402 and second variable resistor 406 may be implemented with transistors similar to transistor 422 (as further discussed in connection with FIG. 4B). In other embodiments, however, first variable resistor 402 and second variable resistor 406 may be implemented with alternative devices that allow control of their resistive values.

Figure 4B:
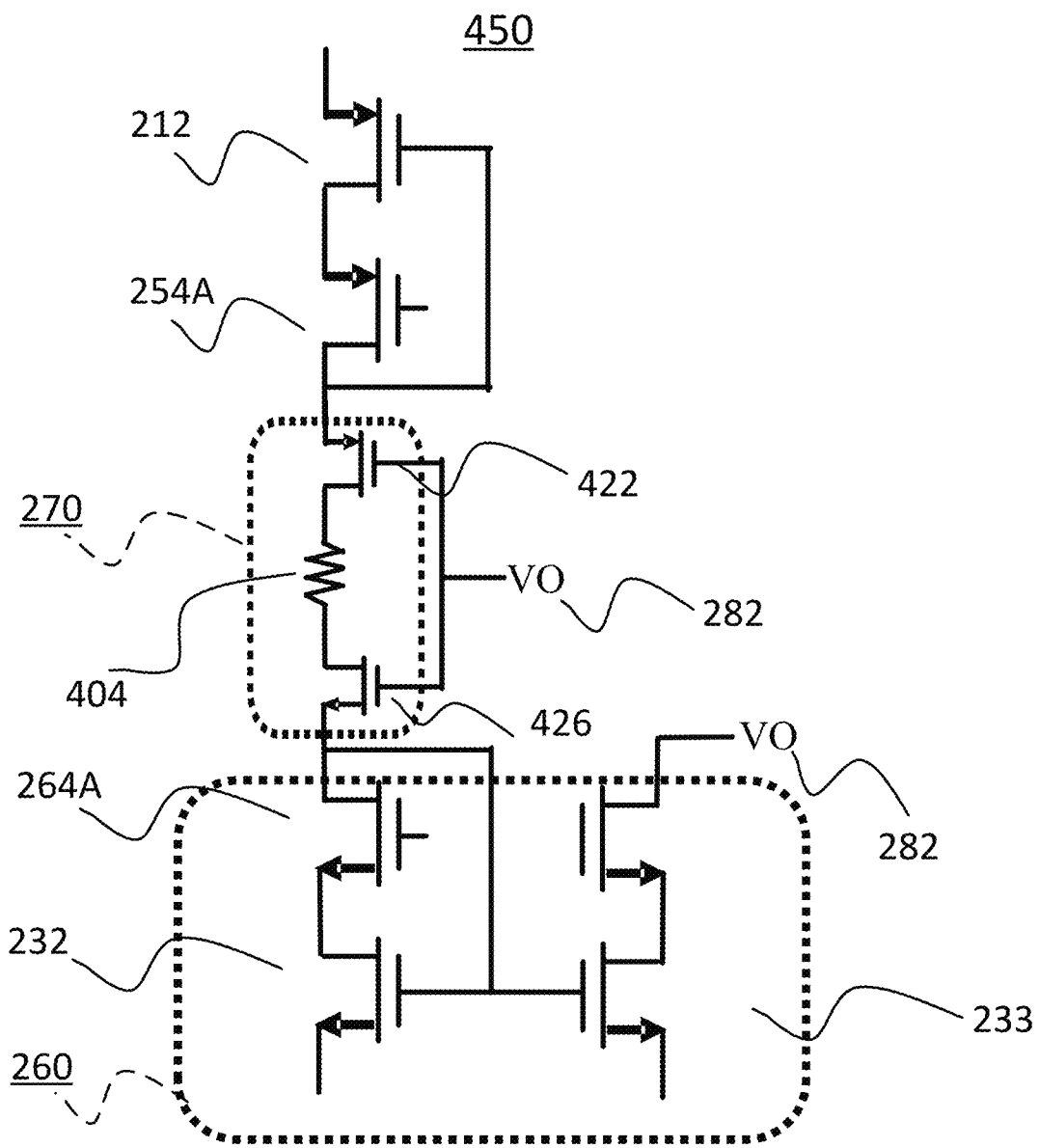
FIG. 4B shows a circuit diagram of an exemplary configuration of operational amplifier using triode transistors in accordance with some embodiments of the present disclosure.

FIG. 4B shows a circuit diagram of an exemplary configuration 450 of operational amplifier 200 using transistors as variable resistors in accordance with some embodiments of the present disclosure. In configuration 450, the resistive element 270 is implemented with a PMOS transistor 422, resistor 404, and an NMOS transistor 426. Configuration 450 shows an implementation of configuration 400 in which the variable resistors are implemented using transistors. Thus, in some embodiments, as shown in FIG. 4B, first variable resistor 402 and second variable resistor 406 (FIG. 4A) are implemented with PMOS transistor 422 and NMOS transistor 426 respectively.

Configuration 450 uses a combination of PMOS and NMOS transistors to facilitate manufacturing of resistive element 270 and create self-biasing based on VO at output node 282. But other configurations are also possible using both only NMOS or PMOS transistors, or different types of devices (e.g., BJT).

In configuration 450, the gates of PMOS transistor 422 and NMOS transistor 426 are directly connected to output node 282. This configuration creates a feedback through PMOS transistor 422 and NMOS transistor 426. With this configuration 450, when amplifier 200 output VO is low, the PMOS transistor 422 resistance will decrease while the NMOS transistor 426 resistance will increase. And when NMOS transistor 426 resistance increase, the NMOS transistor 232/NMOS transistor 233 Vgs further decreases and the over-drive voltage (Vov), defined as the voltage between gate-to-source ($V_{gs}$) in excess of the threshold voltage, of NMOS transistor 233 will also decrease. This type of feedback in resistive element 270 enables accurate control of the gain and dynamic, self-biasing adjustments to maintain a target DC gain and dynamic range.

PMOS transistor 422 and NMOS transistor 426 in configuration 450 may be implemented with finFETs. For example, PMOS transistor 422 may be implemented with three finFETs coupled in parallel, each of the finFETs having L=8n and M=24, where L defines the transistor length based on the selected process node and M defines the transistor type. Similarly, NMOS transistor 426 may be implemented with three finfets coupled in parallel each of the finFETs having L=8n and M=24. In such embodiments, the value of resistor 404 may be in the kilo-ohms range. For example, resistor 404 may be between 1-100 KΩ. For example, resistor 404 may have a 1.8 KΩ value.

FIG. 5A shows an exemplary circuit diagram of first boosting stage 252 in accordance with some embodiments of the present disclosure. First boosting stage 252 provides additional gain to amplifier 200. As described in connection with FIG. 2, first boosting stage 252 may be within first stage 250 (FIG. 2).

First boosting stage 252 includes a first input substage 512. First input substage 512 includes input PMOS transistors 506A and 506B. One of the source/drain nodes of PMOS transistors 506A and 506B is directly connected and coupled to power node 214. The opposite source/drain nodes of PMOS transistors 506A and 506B are connected to a first output VOPN 506 and a second output VOPP 508. The gates of PMOS transistors 506A and 506B are coupled to a first input VPP 502 and a second input VPN 504. In some embodiments, the of inputs PMOS transistors within first input substage 512 may be matched, having the same dimensions, biasing, and operation. In other embodiments, however, the input PMOS transistors within first input substage 512 may be independent.

First boosting stage 252 also includes a first loading substage 510. First loading substage 510 includes NMOS transistors 507A and 507B that are connected to PMOS transistors 506A and 506B in first input substage 512 and to ground node 234. For example, first input substage 512 may include PMOS transistors 506A and 506B coupled to power node 214. Further, the gates of NMOS transistors 507A and 507B are shorted and they may be connected to an input node VB1. Similarly as discussed in connection with FIG. 3B, the input of node VB1 may be selected to place NMOS transistors 507A and 507B in a triode region to act as an active load. The effective impedance value of the loading substage 510 may be selected based on the desired gain, SNR, dynamic range, or a combination of these parameters. The first loading substage 510 embodiment of FIG. 5A, however, is one option and alternative embodiments are discussed below in connection with FIGS. 6A-6E.

FIG. 5B shows an exemplary circuit diagram of second boosting stage 262 in accordance with some embodiments of the present disclosure. Second boosting stage 262 provides additional gain to amplifier 200. As described in connection with FIG. 2, second boosting stage 262 may be within first stage 260 (FIG. 2).

Second boosting stage 262 includes a second input substage 532. Second input substage 532 includes input NMOS transistors 533A and 533B. One of the source/drain nodes of the input. NMOS transistors 533A and 533B within second input substage 532 is directly connected and coupled to ground node 234 (FIG. 2). For example, second input substage 532 can be coupled to drain/source nodes of each of NMOS transistors 264, where the second loading substage is coupled to a gate nodes of each of NMOS transistors 533A and 533B. Additionally NMOS transistors 533A and 533B are coupled to ground node 234.

The opposite source/drain nodes of input NMOS transistors 533A and 533B are connected to a first output VONP 526 and a second output VONN 528. The gates of NMOS transistors 533A and 533B are coupled to a first input VNP 522 and a second input VNN 524. In some embodiments, the input NMOS transistors within second input substage 532 may be matched, having the same dimension, biasing, and operation. In other embodiments, however, the input NMOS transistors within second input substage 532 may be independent.

Second boosting stage 262 also includes a second loading substage 530. Second loading substage 530 includes PMOS transistors 531A and 531B that are connected to NMOS transistors 533A and 533B in the second input substage 532 and to power node 214. Further, the gates of PMOS transistors 531A and 531B in second loading substage 530 are shorted and they may be connected to an input node VB2. As discussed in connection with FIG. 3B, the input of VB2 may be applied to place PMOS transistors 531A and 531B in a triode region and act as an active load. The effective impedance value of the second loading substage 530 may be selected based on the desired gain, SNR, dynamic range, or a combination of these parameters.

FIGS. 6A-6E show circuit diagrams of exemplary boosting stages using different loading devices. Depending on the application, integrated circuit area restrictions, or power targets, a designer may elect different loading mechanisms or devices for boosting stages.

Figure 6A:
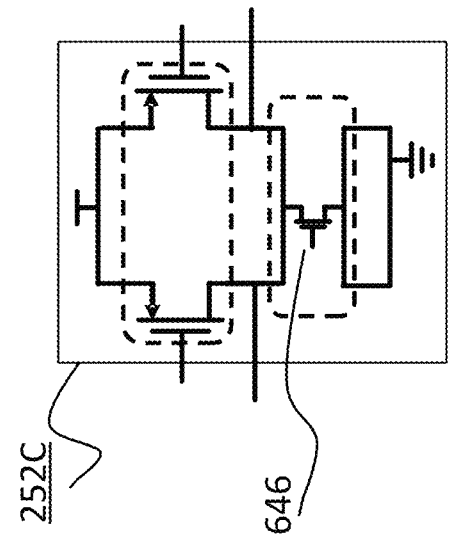
FIG. 6A shows a circuit diagram of an exemplary boosting stage using a resistive load in accordance with some embodiments of the present disclosure.

FIG. 6A shows a circuit diagram of an exemplary boosting stage 252A using a resistive load in accordance with some embodiments of the present disclosure. In boosting stage 252A of FIG. 6A, the loading substage uses passive loading with a loading resistor 642. Although loading resistor 642 is shown as a single resistor, loading resistor 642 may include a network of passive resistors.

Figure 6B:
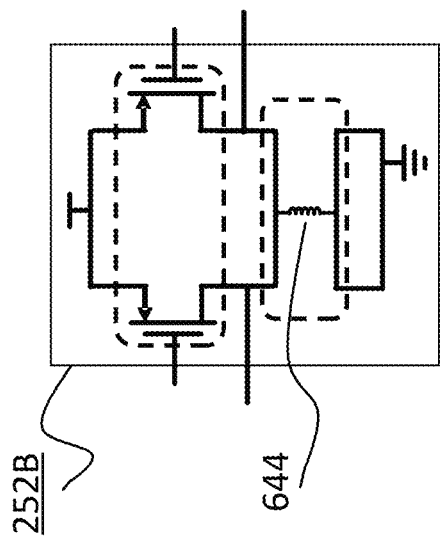
FIG. 6B shows a circuit diagram of an exemplary boosting stage using an inductive load in accordance with some embodiments of the present disclosure.

FIG. 6B shows a circuit diagram of an exemplary boosting stage 252B using an inductive load in accordance with some embodiments of the present disclosure. In boosting stage 252B of FIG. 6B, the loading substage uses passive loading with a loading inductor 644. Although loading inductor 644 is shown as a single inductor, loading inductor 644 may include a network of inductors and/or capacitors with an equivalent impedance that is desired for the loading substage. In certain embodiments, boosting stages 252B can combine embodiments of FIGS. 6A and 6B having resistor 642 or inductor 644, or combinations thereof.

Figure 6C:
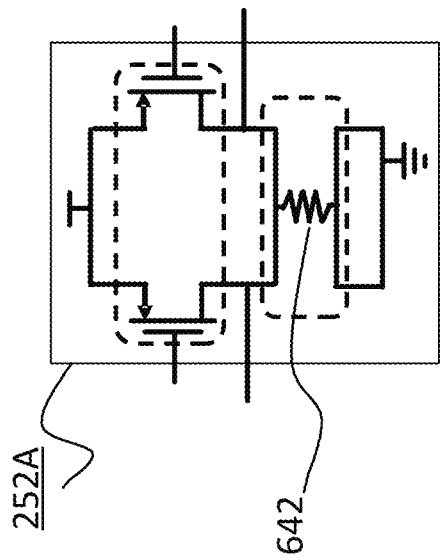
FIG. 6C shows a circuit diagram of an exemplary boosting stage using an active load in accordance with some embodiments of the present disclosure.

FIG. 6C shows a circuit diagram of an exemplary boosting stage 252C using an active load in accordance with some embodiments of the present disclosure. In boosting stage 252C of FIG. 6C, the loading substage uses active loading with a loading transistor 646. Although loading transistor 646 is shown as a single device, loading transistor 646 may include a network of transistors. For example, a possible implementation of boosting stage 252C of FIG. 6C is first loading substage 510 that uses back-to-back transistors. Similarly, other embodiments may include networks of transistors coupled in parallel, series, or a combination of parallel and series.

Figure 6D:
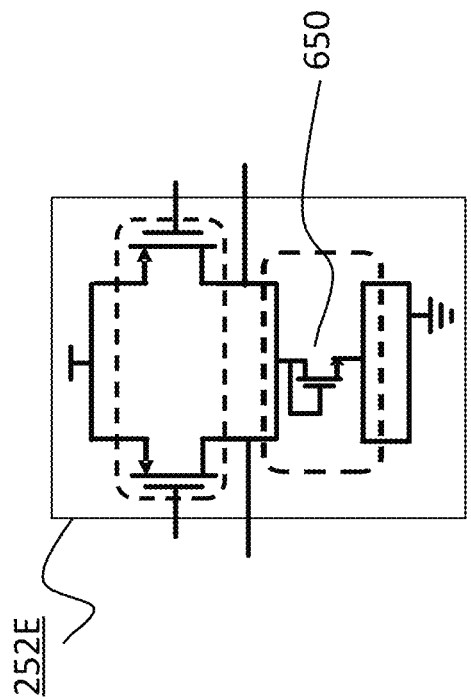
FIG. 6D shows a circuit diagram of an exemplary boosting stage using an active PMOS diode load in accordance with some embodiments of the present disclosure.

FIG. 6D shows a circuit diagram of an exemplary boosting stage 252D using an active PMOS diode load in accordance with some embodiments of the present disclosure. In boosting stage 252D of FIG. 6D, the loading substage uses active loading with a PMOS diode 648. Although PMOS diode 648 is shown as a single MOS device with a shorted gate, PMOS diode 648 may include a network of transistors or standard diodes (not CMOS) or Zener and/or Schottky diodes.

Figure 6E:
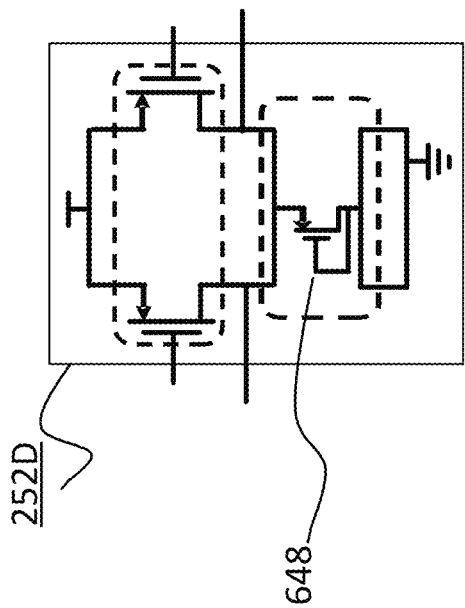
FIG. 6E shows a circuit diagram of an exemplary boosting stage using an active NMOS diode load in accordance with some embodiments of the present disclosure.

FIG. 6E shows a circuit diagram of an exemplary boosting stage 252E using an active NMOS diode load in accordance with some embodiments of the present disclosure. In boosting stage 252E of FIG. 6E, the loading substage uses active loading with an NMOS diode 650. Although NMOS diode 650 is shown as a single MOS device with a shorted gate, NMOS diode 650 may include a network of transistors or standard diodes (not CMOS), including (for example) Zener and/or Schottky diodes.

Figure 7:
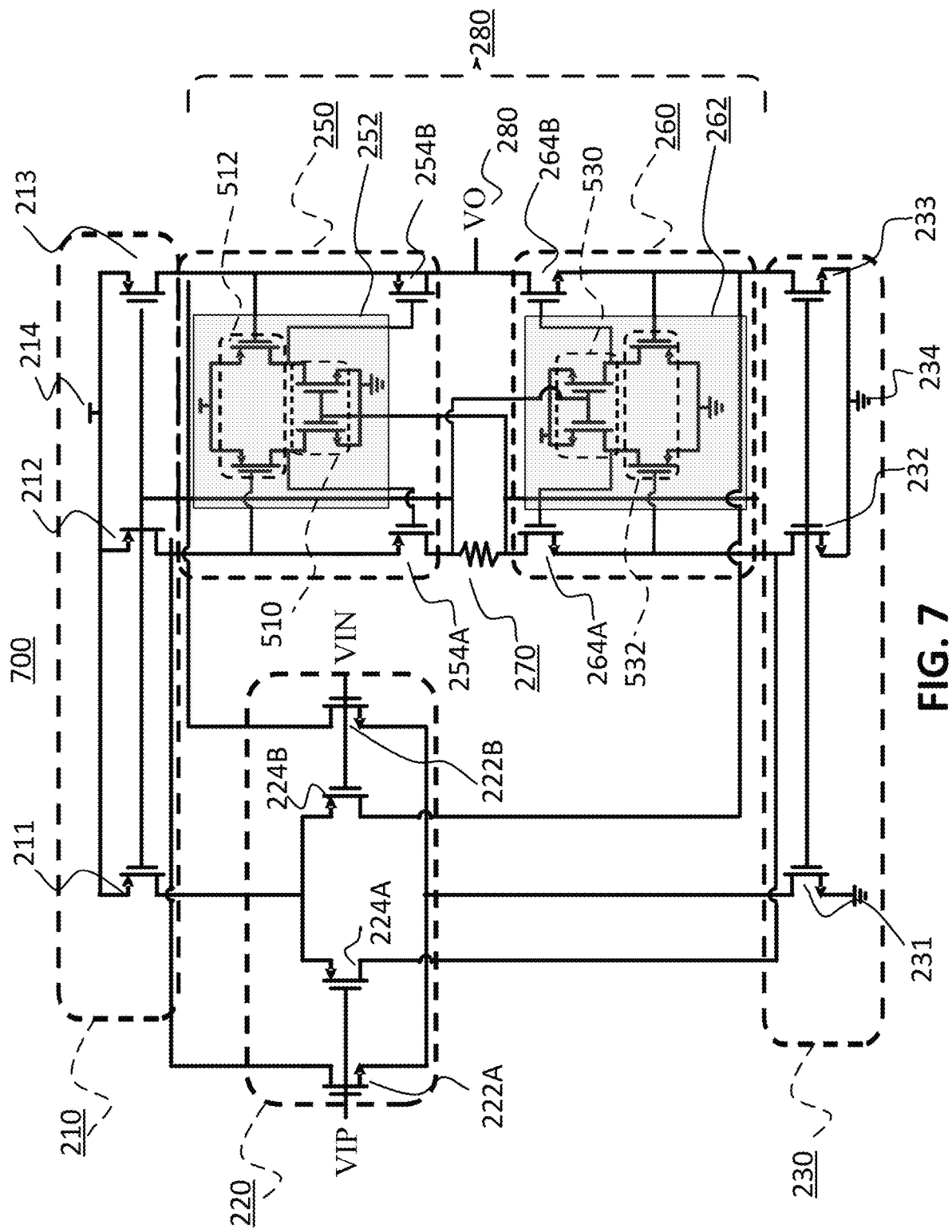
FIG. 7 shows a circuit diagram of a first exemplary amplifier with active loads and resistive coupling for subthreshold biasing in accordance with some embodiments of the present disclosure.

FIG. 7 shows a circuit diagram of a first exemplary amplifier 700 with active loads and resistive coupling for subthreshold biasing in accordance with some embodiments of the present disclosure. Amplifier 700 embodies a possible implementation of amplifier 200. Like amplifier 200, amplifier 700 also includes differential input circuit 220, positive biasing circuit 210, negative biasing circuit 230, amplification circuit 280 (including first stage 250 and second stage 260), and resistive element 270 between first stage 250 and second stage 260. However, in amplifier 700 first boosting stage 252 (within the first stage 250) is implemented with the boosting stage shown in FIG. 5A, second boosting stage 262

(within second stage 260) is implemented with the boosting stage shown in FIG. 5B, and resistive element 270 is implemented with resistor 302 (FIG. 3).

As shown in FIG. 7, the resulting circuit includes a plurality of direct connections between the different transistors in amplifier 700. For example, as shown in FIG. 7 one end of resistive element 270 is directly connected to a transistor in first stage 250 (e.g., PMOS transistor 254A), a gate of drive PMOS transistor 212, and to gates of loading transistors in the second boosting stage (e.g., transistors in loading substage 530). The opposite end of resistive element 270 is directly connected to a transistor in the second stage 260 (e.g., NMOS transistor 264A), a gate of drive NMOS transistor 232, and also to gates of loading transistors in the first boosting stage (e.g., transistors in loading substage 510). Further, a gate of PMOS transistor 254A is directly connected to drain/source nodes of transistors in the first boosting stage 252. In addition, a gate of NMOS transistor 264A is directly connected to drain/source nodes of transistors in the second boosting stage 262. Thus, amplifier 700 can be configured so that a gate of drive PMOS transistor 212 is directly connected to a first terminal of resistive element 270, and a gate of drive NMOS transistor 232 is directly connected to a second terminal of resistive element 270. In such configuration, the first terminal of resistive element 270 is directly connected to second loading substage 530 and second terminal of resistive element 270 is directly connected to first loading substage 510.

FIG. 7 also shows connections between transistors in the first input substage 512 and the second input substage 532 and other elements of amplifier 700. For example, as shown in FIG. 7 gates of first input substage 512 are connected to drain source nodes of positive biasing circuit 210. And gates of second input substage 532 are connected to drain source nodes of negative biasing circuit 230. Moreover, the gate of PMOS transistor 254B is directly connected to drain/source nodes of transistors in the first boosting stage 252. In addition, a gate of NMOS transistor 264B is directly connected to drain/source nodes of transistors in the second boosting stage 262.

Amplifier 700 shows an implementation of amplifier 200 in which the boosting substages use active loading and resistive element 270 uses a passive load. This type of implementation may be employed to improve control of the boosting stages while minimizing power and area expenditures for coupling between first stage 250 and second stage 260.

Figure 8:
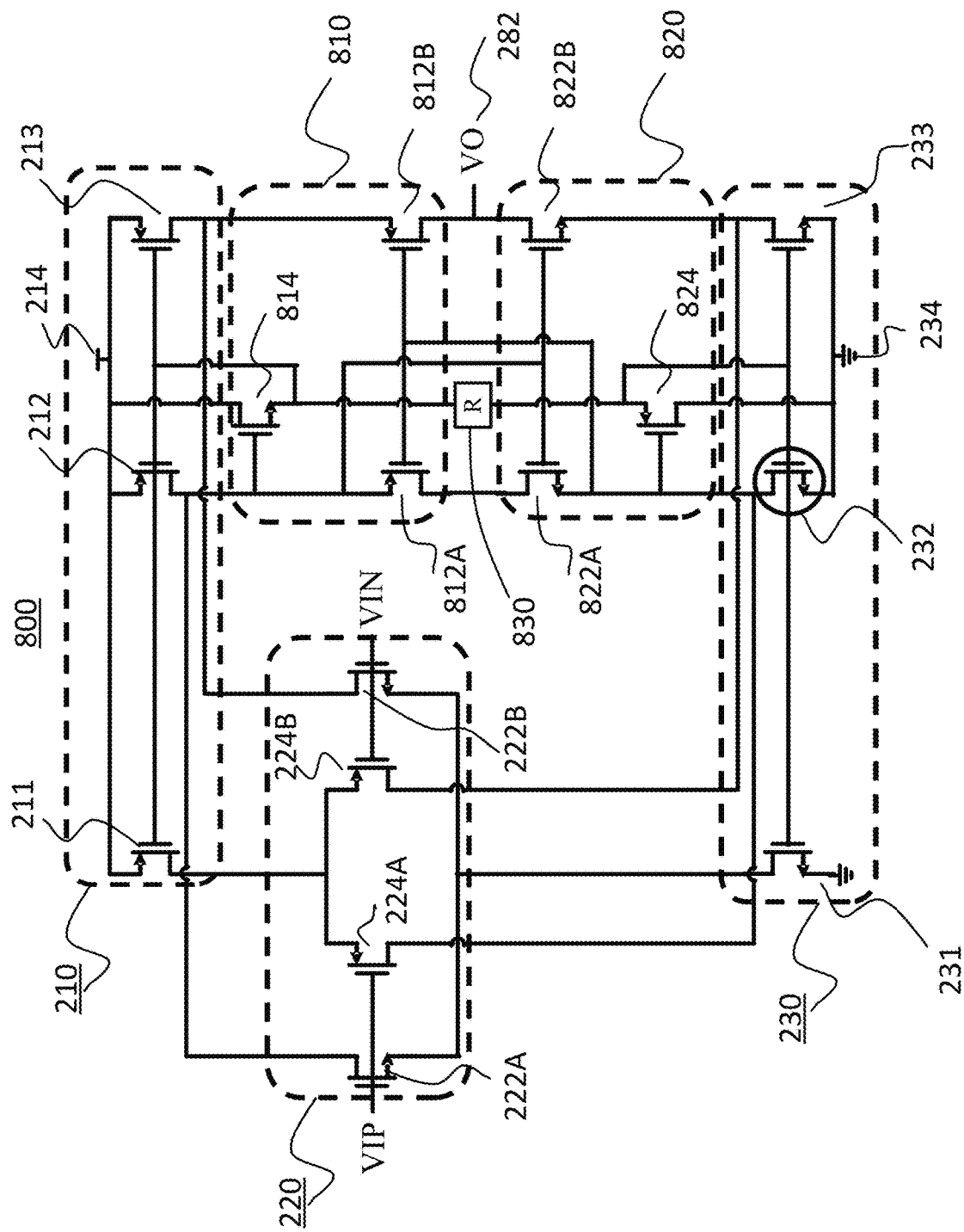
FIG. 8 shows a circuit diagram of a second exemplary amplifier with subthreshold biasing using a coupling resistor in accordance with some embodiments of the present disclosure.

FIG. 8 shows a circuit diagram of a second exemplary amplifier 800 with subthreshold biasing using a coupling resistor in accordance with some embodiments of the present disclosure. Amplifier 800 embodies an alternative implementation of amplifier 200 that does not use boosting stages and places the coupling resistive element between stages at a different node. Amplifier 800 still places drive NMOS transistor 232 in the subthreshold region by using a resistive element to couple stages of an amplification circuit. However, between different elements of the stages to avoid using the boosting stages and minimize a footprint and/or power consumption. This implementation, however, may result in narrower dynamic ranges.

Amplifier 800, like amplifier 200, includes positive biasing circuit 210, negative biasing circuit 230, and differential input circuit 220. However, instead of having first stage 250 and second stage 260, amplifier 800 has stages without boosting. Amplifier 800 has a first stage 810 including PMOS transistors 812 and a coupling NMOS transistor 814. The PMOS transistors 812 include a PMOS transistor 812A (which can be similar to PMOS transistor 254A) and a PMOS transistor 812B (which can be similar to PMOS transistor 254B). However, instead of having first boosting stage 252, first stage 810 includes coupling NMOS transistor 814. The source/drain nodes of coupling NMOS transistor 814 are connected to power node 214 and a resistive element 830 respectively. Also, the gate of coupling NMOS transistor 814 is coupled to drive PMOS transistor 212 and PMOS transistor 812A.

Amplifier 800 also has a second stage 820 including NMOS transistors 822 and a coupling PMOS transistor 824. NMOS transistors 822 include an NMOS transistor 822A (which can be similar to NMOS transistor 264A) and an NMOS transistor 822B (which may be similar to NMOS transistor 264B). However, instead of having second boosting stage 262, second stage 820 includes a coupling PMOS transistor 824. The source/drain nodes of coupling PMOS 824 are connected to ground node 234 and resistive element 830, respectively. Also, the gate of coupling PMOS 824 is coupled to drive NMOS transistor 232 and NMOS transistor 822A.

Unlike first stage 250 and second stage 260, which are coupled via resistive element 270 and output node 282, first stage 810 and second stage 820 are coupled through resistive element 830, output node 282, and other direct connections between elements of the stages. For example, as shown in FIG. 8, NMOS transistor 822A and PMOS transistor 824A are directly connected (without resistive element 270 as in amplifier 200). Also, the gates of PMOS transistors 812 are directly connected to each other (without the boosting stage) and they are connected to a drain/source node of NMOS transistor 822A. Further, the gates of NMOS transistors 822 are directly connected to each other (without the boosting stage) and the gates are connected to a drain/source node of PMOS transistor 812A.

In addition, first stage 810 and second stage 820 are connected through resistive element 830. Resistive element 830 connects the coupling NMOS transistor 814 and the coupling PMOS 824. The resistive element 830 is also directly connected to the gate of drive NMOS transistor 232. Such configuration results in a biasing in the subthreshold region for drive NMOS transistor 232. With an appropriately selected resistive element 830, drive NMOS transistor 232 may be set in the subthreshold region. Resistive element 830 may be selected from the elements discussed above for resistive element 270. That is, resistive element 830 may be implemented with passive, active, or combined loads. For example, resistive element 830 may be implemented simply with a resistor (see FIG. 3A) or an inductive element. Resistive element 830, however, may also be implemented with a transistor (see FIG. 3B). Further, resistive element 830 may also be implemented with a diode (see FIG. 3C).

The biasing configuration in amplifier 800 provides, at least partially, the advantages discussed above in connection of FIG. 2 because amplifier 800 also operates drive transistors in the subthreshold region. For example, amplifier 800 also achieves greater DC gain than conventional amplifiers and has the potential of operating at greater range of output voltages. Amplifier 800 can also be manufactured in a smaller area (because it has fewer transistors) and may be employed for applications that require lower power consumption. Circuit designers can combine embodiments of amplifiers 200, 700, and 800 based on gain, power, and area conditions and/or restrictions of specific applications.

Figures 9A, 9B:
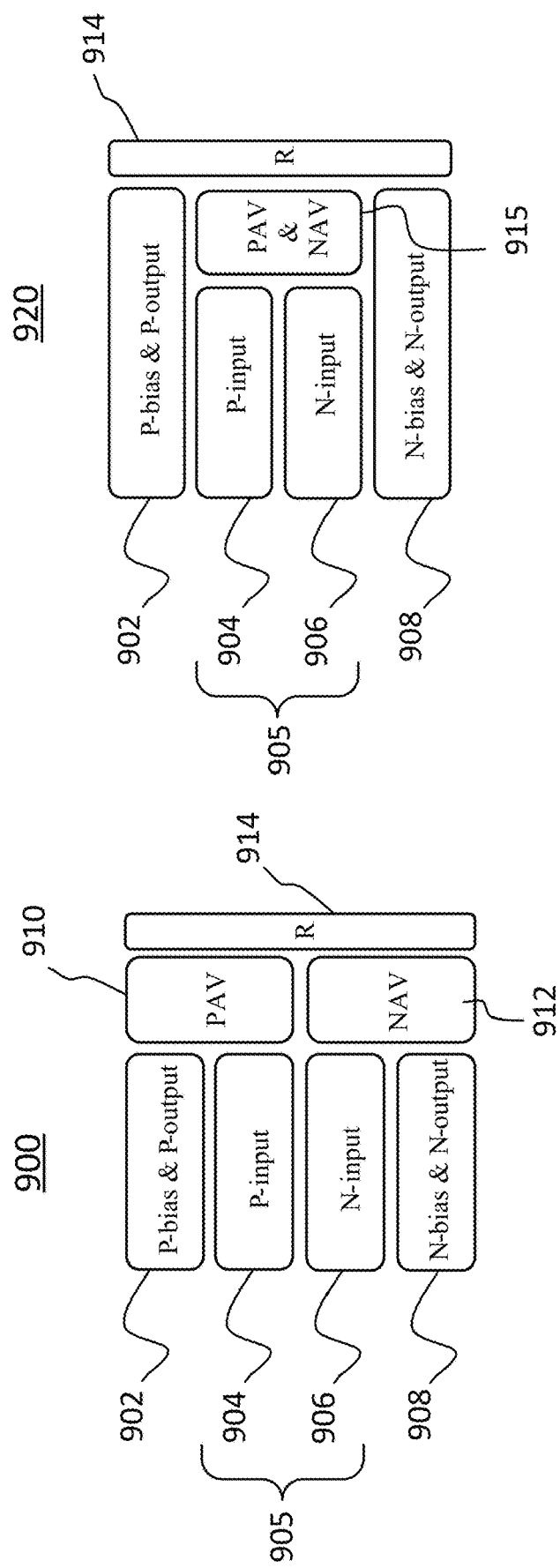
FIG. 9A shows an exemplary schematic of a first layout floor plan for an integrated circuit in accordance with some embodiments of the present disclosure.
FIG. 9B shows an exemplary schematic of a second layout floor plan for an integrated circuit in accordance with some embodiments of the present disclosure.

FIG. 9A shows an exemplary schematic of a first layout first floor plan 900 for an integrated circuit in accordance with some embodiments of the present disclosure. First floor plan 900 may be used to implement amplifier 200, amplifier 700, and/or amplifier 800. First floor plan 900 includes a positive biasing area 902. In some embodiments, positive biasing area 902 may include elements of positive biasing circuit 210. Further positive biasing area 902 may also include elements of differential input circuit 220, such as PMOS transistors 224A and 224B. In such embodiments, positive biasing area 902 includes drive PMOS transistor 212. First floor plan 900 also includes a negative biasing area 908. In some embodiments, negative biasing area 908 may include elements of negative biasing circuit 230. In such embodiments, negative biasing area 908 includes drive NMOS transistor 232. Further, negative biasing area 908 may also include elements of differential input circuit 220, such as NMOS transistors 222A and 222B.

First floor plan 900 also includes an input area 905 which includes a p-input area 904 and a n-input area 906. Input area 905 may include elements of differential input circuit 220. For example, p-input area 904 may include PMOS transistors 224 and n-input area 906 includes NMOS transistors 222.

First floor plan 900 also includes a first boosting area 910 and a second boosting area 912. In some embodiments, first boosting area 910 may include elements of first stage 250. In other embodiments, first boosting area 910 may include elements of first boosting stage 252 only (excluding, for example, PMOS transistors 254). In some embodiments, second boosting area 912 may include elements of second stage 260. In other embodiments, second boosting area 912 may include elements of second boosting stage 262 only (excluding, for example, NMOS transistors 264).

First floor plan 900 also includes a resistive area 914, which may include resistive element 270. Alternatively, or additionally, resistive area 914 may include resistive element 830. For example, resistive area 914 may include resistor 302, transistor 304, or diode 306 (FIGS. 3A-3C). Further, resistive area 914 may connect between first boosting area 910 and second boosting area 912.

First floor plan 900 shows a possible configuration of the different areas for amplifiers 200, 700, or 800. As shown in FIG. 9, input area 905 is between positive biasing area 902 and negative biasing area 908. In particular, while p-input area 904 neighbors and contacts positive biasing area 902, n-input area 906 neighbors and contacts negative biasing area 908. And p-input area 904 and n-input area 906 neighbor, contact, and/or are adjacent to each other.

In addition, in first floor plan 900, first boosting area 910 neighbors, contacts, and/or is adjacent to both positive biasing area 902 and p-input area 904 on the same side of first boosting area 910. Second boosting area 912 neighbors, contacts, and/or is adjacent to both negative biasing area 908 and n-input area 906 on the same side of second boosting area 912. Also, first boosting area 910 and second boosting area 912 neighbor, contact, and/or are adjacent to each other on a side that is different than the side adjacent, neighboring, or contacting other areas of first floor plan 900.

In first floor plan 900, resistive area 914 neighbors, contacts, and/or is adjacent to both first boosting area 910 and second boosting area 912 on the same side of resistive area 914. Further, as shown in first floor plan 900, resistive area 914 may only neighbor first boosting area 910 and second boosting area 912, being separated from input area 905, positive biasing area 902, and negative biasing area 908.

Thus, as shown in FIG. 9A, an integrated circuit implementing disclosed amplifiers can be arranged so that positive biasing area 902 neighbors first boosting stage 910 and the p-input area 904. Further, negative biasing area 908 neighbors the second boosting stage 912 and the n-input area 906. Additionally, or alternatively, resistive area 914 neighbors the first boosting stage area 910 and the second boosting area 912.

FIG. 9B shows an exemplary schematic of a second layout floor plan 920 for an integrated circuit in accordance with some embodiments of the present disclosure. Second floor plan 920 may be used to implement amplifiers 200, 700, and/or 800.

Similar to first floor plan 900, second floor plan 920 includes positive biasing area 902, negative biasing area 908, and input area 905 which includes p-input area 904 and n-input area 906. However, unlike first floor plan 900, second floor plan 920 combines boosting areas in a single boosting area 915. While first floor plan 900 has first boosting area 910 and second boosting area 912, second floor plan 920 has a single boosting area 915 which may combine elements of first stage 250 and second stage 260. Alternatively, boosting area 915 may include elements of first boosting stage 252 and second boosting stage 262 only.

Combining boosting elements in boosting area 915 generates a different organization for second floor layout 920. In second floor layout 920, boosting area 915 is surround by other areas. For example, boosting area 915 neighbors on one side with input area 905. On an opposite side, boosting area 915 neighbors with resistive area 914. On a third side, boosting area neighbors, is adjacent, and/or contacts positive biasing area 902. And on a fourth side, opposite to the third side, boosting area 915 neighbors, is adjacent, and/or contacts negative biasing area 908. Further, in second floor layout 920, resistive area 914 neighbors, contacts, and/or is adjacent to positive biasing area 902 and negative biasing area 908, in addition to the input area 905.

Other elements in second floor plan 920 have a similar disposition as in first floor plan 900. For example, input area 905 is disposed between positive biasing area 902 and negative biasing area 908, where p-input area 904 neighbors, contacts, and/or is adjacent to positive biasing area 902 while n-input area 906 neighbors, contacts, and/or is adjacent to negative biasing area 908.

Figure 10:
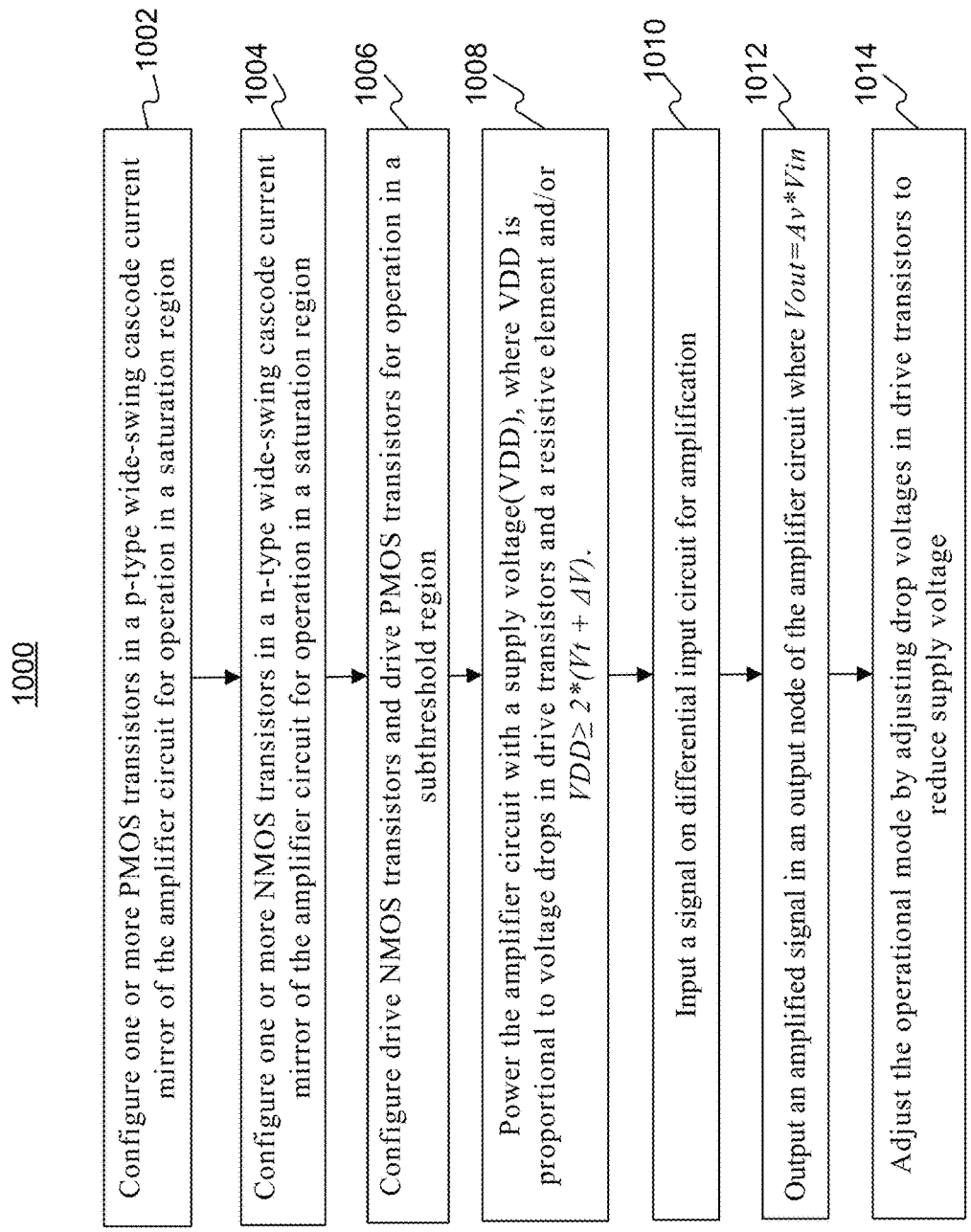
FIG. 10 shows a flow chart of an exemplary method of operation of an amplifier circuit in accordance with some embodiments of the present disclosure.

FIG. 10 shows a flow chart of an exemplary method 1000 for operation of an amplifier circuit in accordance with some embodiments of the present disclosure. In some embodiments, disclosed amplifiers 200, 700, and/or 800 may operate based on method 1000. For example, transistors in amplifier 200 may be biased, connected, and/or operated based on method 1000 to provide a gain at output node 282 when an input signal is inputted at first amplifier input VIP 202 and/or second amplifier input VIN 204.

Method 1000 may initiate in step 1002. In step 1002, one or more PMOS transistors within a p-type wide-swing cascode current mirror of an amplifier circuit are configured for operation in a saturation region. For example, in step 1002, first PMOS transistor 254A may be biased in a saturation region. The PMOS transistors biased in saturation region in step 1002 may be connected to drive transistors of the amplifier. For example, in step 1002, PMOS transistor 254A may be biased for operation in saturation region while it is directly connected to drive PMOS transistor 212.

In step 1004, one or more NMOS transistors within an n-type wide-swing cascode current mirror of an amplifier circuit are configured for operation in a saturation region. For example, in step 1004, first NMOS transistor 264A may be biased so it operates in a saturation region. The NMOS transistors biased in saturation region in step 1004 may be connected to drive transistors of the amplifier. For example, in step 1004, NMOS transistor 264A may be biased for operation in saturation region while it is directly connected to drive NMOS transistor 232.

In step 1006, drive NMOS transistor 232 and drive PMOS transistor 212 are configured for operation in a subthreshold region. As further described above in connection with FIG. 2, a resistive element may couple NMOS with PMOS transistors in amplifier circuits. For example, in amplifier 200, resistive element 270 connects first NMOS transistor 264A and first PMOS transistor 254A. This configuration will enable operating drive NMOS transistor 232 and drive PMOS transistor 212 in subthreshold. Without resistive element 270, drive NMOS transistor 232 and drive PMOS transistor 212 could not be both operated in subthreshold regions because the gates of drive NMOS transistor 232 and drive PMOS transistor 212 would be connected together. But resistive element 270 can be used to decouple gates of drive NMOS transistor 232 and drive PMOS transistor 212, allowing a configuration with both drive NMOS transistor 232 and drive PMOS transistor 212 operating in the subthreshold region.

In step 1008, the amplifier circuit may be powered using a supply voltage. For example, amplifier 200 may be powered by inputting the supply voltage on power node 214. The supply voltage may be selected based on the configuration of transistors in the amplifier, desired currents, and the biasing of transistors in steps 1002 and 1004. For example, in some embodiments the supply voltage applied to power nodes of the amplifiers may be proportional to a sum of a voltage drops in drive transistors and in the resistive element. The supply voltage used to power amplifier 200 may also (or alternatively) be proportional to a sum of the voltage drop on drive NMOS transistor 232, the voltage drop on resistive element 270, and the voltage drop on drive PMOS transistor 212. Further, in some embodiments, the selected supply voltage (VDD) may be equal to the sum of the voltage drop on drive NMOS transistor 232 (Vgs_232), the voltage drop on resistive element 270(Vr_270), and the voltage drop on drive PMOS transistor 212 (Vgs_212). Thus, in some embodiments, VDD=Vgs_232+Vr_270+Vgs_212. Further, Vr_270 can be set based on a current through drive NMOS transistor 232, resistive element 270, and drive PMOS transistor 212 as Vr_270=I*R, where I is the current and R is the equivalent resistance of resistive element 270.

Moreover, the supply voltage (VDD) of step 1008 may also be selected based on the threshold voltage and overdrive conditions of transistors in the amplifier circuit. For example, in certain embodiments the supply voltage (VDD) may be selected to be at least two times the sum of a threshold voltage of transistors in the p- and n-types wide-swing cascode current mirrors (Vt) and an overdrive voltage (ΔV) of the transistors biased in saturation region. Thus, for such embodiments, in step 1006 VDD≥2*(Vt+ΔV).

Steps 1002-1008 of method 1000 allow the configuration of a self-biased amplifier without external biases and without any degradation in its AC performance. The method enables the use of an amplifier circuit with enhanced gain that maintains a wide dynamic range.

In step 1010, a signal may be inputted on a differential input circuit of the amplifier circuit. For example, in step 1010 a signal may be inputted on differential input circuit 220 of amplifier 200. As discussed in connection with FIG. 1, the differential input to amplifier 200 may be signal CKP 102 and signal CKN 104.

The inputted signal is amplified by the amplifier circuit. And based on the configuration setup in steps 1002-1008, the amplifier circuit produces an amplified output. Thus, in step 1012 the amplifier circuit may generate an output in an output node that is based on the differential input signal. For example, in step 1012 amplifier 200 may generate an output at output node 282. As described in connection with FIG. 1, the output generated by amplifier 200 may be used as a control signal in a DCC.

The gain generated by the amplifier circuit in step 1012 is based on a boosted gain stage and an input gain stage. The input gain stage may be based on the configuration of the differential input circuit 220. For example, the input gain stage may be based on the transconductance of transistors in differential circuit 220. In some embodiments, the input gain stage in amplifier 200 may be proportional to the transconductance of NMOS transistors 222 and PMOS transistors 224. The boosted gain stage may be based on the configuration of amplification circuits. For example, the boosted gain stage may be based on the transconductance and output resistance of amplification circuit 280. In some embodiments, the boosted gain stage in amplification circuit 280 may be based on the configuration of first boosting stage 252 and second boosting stage 262. The boosted gain stage may be proportional to the transconductance of first input substage 512, first loading substage 510, second loading substage 530, second input substage 532 and the output resistance of the amplification stages. In some embodiment the total gain of amplification circuit could be determined based on the gain of first boosting stage 252 (Avp, based on the transconductance of first input substage 512), and the gain of the second boosting stage (Avn, proportional to the transconductance of second input substage 532). The gain in these stages then determine equivalent resistances of first stage 250 (R250) and second stage 260 (R260). Specifically:

$$R250 = g\_213\text{-}254B * r\_254B(r\_213/r\_222B) * Avp,$$

where (i) g_213-254B is the combined transconductance in second bias PMOS transistor 213 and second PMOS transistor 254B, (ii) r_254B is the output resistance for second PMOS transistor 254B, (iii) r_213 is the output resistance of second bias PMOS transistor 213, (iv) r_222B, is the output resistance of NMOS transistor 222B, and (v) Avp is the gain of first boosting stage 252. Further, $$R260 = g233\_264B * r\_264B(r\_233/r\_224B) * Avn,$$

where (i) g233_264B is the combined transconductance in second biasing NMOS transistor 233 and second NMOS transistor 264B, (ii) r_264B is the output resistance for second NMOS transistor 264B, (iii) r_233 is the output resistance of second biasing NMOS transistor 233, (iv) r_224B, is the output resistance of PMOS transistor 224B, and (v) Avn is the gain of second boosting stage 262.

The equivalent resistances R250 and R260 of the boosting stages determine the total gain of the amplifier circuit, defined as $$Av = (g\_222 + g\_224)(R250/R260),$$

where (i) g_222 is the transconductance of NMOS transistors 222 and (ii) g_224 is the transconductance of PMOS transistors 224. Accordingly, in step 1012, the amplifier circuit may generate an output that is proportional to Av and the differential input signal. In some embodiments, the amplifier circuit generates an output that multiplies the input signal and Av to generate an output that is equal to Vout=Av*Vin.

In some embodiments, method 1000 may include a step of adjusting the operational mode. For example, in step 1014, drop voltages in drive transistors may be reduced to adjust the power supply. In step 1008, the supply voltage is determined based on threshold voltages, overdrive voltages, and voltage drops. These voltages may be adjusted to, for example, reduce the supply voltage for low power operations. Thus, in step 1014, the amplifier circuit may initiate a low voltage application by reducing the supply voltage. For example, drive NMOS transistor 232 may be re-biased to have a lower voltage drop at the drive NMOS transistor 232. Alternatively, or additionally, step 1014 of method 1000 may include reducing the overdrive voltage to operate under a low voltage application and increasing an output swing. Accordingly, method 1000 enables the adjustment of biasing statutes and the selection of currents in the wide-swing cascode current mirror to control the supply voltage and adjust for different operational modes.

The disclosed amplifiers, circuit configurations, and biasing conditions improve the operation of amplifiers and resolve technical challenges of other designs. Further, the disclosed configurations facilitate integrated circuit fabrication by, for instance, minimizing required external biases for the operational amplifier.

For example, disclosed amplifiers 200, 700, and/or 800 facilitate the operation and configuration of operational amplifiers by reducing the number of external bias voltages that are necessary to operate the circuit. The disclosed configuration of an amplifier with a positive biasing circuit, a negative biasing circuit, and amplifier circuit (with several stages and a resistive element) address drawbacks of conventional amplifiers. Conventional operational amplifiers (particularly folded cascode amplifiers) may use a large number of external bias voltages. Such large number of external bias voltages creates both performance and fabrication issues. For example, amplifiers with may external voltages require a larger fabrication area and consume more power (causing overheating issues). Further, amplifiers with a large number of external voltages may experience performance problems as they are more susceptible to noise, cross-talk, and high sensitivity to bias points and bias variations. The disclosed embodiments overcome these problems through a self-biasing configuration in which resistive elements self-bias transistors, resulting in fewer biasing nodes than in alternative approaches. Further, the disclosed embodiments allow self-biasing of transistors without degrading AC performance or the need to increase supply voltage.

In particular, the disclosed embodiments facilitate self-biasing of transistors in the circuit by utilizing resistive elements that self-bias the gain boost stages of the operational amplifier. The disclosed embodiments employ a resistive element (either active or passive) connected to gain boost stages and drive transistors. This configuration facilitates self-biasing of drive and boosting transistors. Further, as discussed in connection with FIG. 2, the resistive element (such as resistive element 270) may be selected and coupled between gain boosting stages to place drive transistors in a subthreshold region. The subthreshold operation region of the drive transistors results in high DC gains without degrading AC performance and minimizes power consumption. The disclosed embodiments result in several advantages for both the operation and fabrication of operational amplifiers (and particularly folded cascode amplifiers). For example, the selection of a resistive element between boosting stages enables operating certain transistors of amplifiers 200, 700, or 800 in the subthreshold region, which reduces power requirements. Also, by operating in the subthreshold region, amplifiers of the disclosed embodiments achieve increased DC gain.

Moreover, in addition to increased DC gain, disclosed embodiments also provide other operational advantages. For example, disclosed embodiments facilitate fabrication of integrated circuits in smaller areas and with lower power consumption. Further, the disclosed amplifier circuits also improve the amplifier's stability and sensitivity to noise because while traditional folded cascode amplifiers have limited signal-to-noise ratios (SNRs)—in part due to the required biasing conditions—the disclosed self-biased configuration minimizes noise sources.

Thus, disclosed embodiments and circuit configurations provide a low voltage, self-biased, and gain-boosted amplifier. The use of resistive elements to self-bias transistors and operate in the subthreshold region improves the amplifier gain, reduces the number of external biasing lines, minimizes potential noise, and improves power consumption characteristics.

Moreover, disclosed embodiments also have a greater operational range. By including resistive elements for self-biasing and subthreshold region operation, the disclosed embodiments improve the dynamic range of the amplifier, allowing it to have strong gains at both low and high output voltages. Other amplifiers have a gaussian gain, with a peak gain at average output voltages but low gain (or even attenuation) at low or high output voltages. For example, other amplifiers may have a peak gain at around VO=350 mV, but low gain for low output voltages (e.g., VO=100 mV) or high output voltages (e.g., VO=650 mV). In contrast, the disclosed embodiments and amplifier configurations result in a better amplification range, with high gain at the extremes of the output voltage. For example, disclosed embodiments achieve greater gains at low (e.g., VO=100 mV) and high (e.g., VO=650 mV) output voltages. Consistent with some of the disclosed configurations, amplifiers achieve 20 dB-30 dB of gain boost at the edges of the output voltage range when compared with other amplifiers.

Moreover, the disclosed configurations can be adapted to different technologies. For example, disclosed embodiments of amplifiers may be implemented in various manufacturing processes including 3 nm, 5 nm, 7 nm, 10 nm, 16 nm, and 20 nm processes.

For at least these reasons, the advantages of the disclosed embodiments result in operational amplifiers with improved performance, easier configuration, and/or simpler fabrication.

It will be understood that not all advantages have been necessarily discussed herein, no particular advantage is required for all embodiments or examples, and other embodiments or examples may offer different advantages.

According to one aspect of the present disclosure, an amplifier circuit includes a positive biasing circuit coupled to a power node and having a drive PMOS, the drive PMOS for biasing in a subthreshold region. The circuit also includes a negative biasing circuit coupled to a ground node and having a drive NMOS, the drive NMOS for biasing in the subthreshold region. The circuit also includes an amplification circuit coupled to the positive biasing circuit and the negative biasing circuit. The amplification circuit includes a first stage with PMOS transistors and a first boosting stage, one of the PMOS transistors being coupled with the drive PMOS. The amplification circuit also includes a second stage including NMOS transistors and a second boosting stage, one of the matching NMOS transistors being coupled with the drive NMOS. The amplification circuit also includes a resistive element coupled between the first stage and the second stage and an output node connected to the first stage and the second stage.

According to another aspect of the present disclosure, a folded cascode operational amplifier includes a positive biasing circuit coupled to a power node and including a drive PMOS. The folded cascode also includes a negative biasing circuit coupled to a ground node and including a drive NMOS and a differential input circuit coupled to the positive biasing circuit and the negative biasing circuit. The folded cascode also includes an amplification circuit coupled to the positive biasing circuit and the negative biasing circuit. The amplification circuit has a first stage coupled with the drive PMOS, a second stage coupled with the drive NMOS, and a resistive element coupled between the first stage and the second stage, the resistive element being directly connected to gates of the drive PMOS and the drive NMOS. In the folded cascode, the value of the resistive element is selected to place at least one of the drive PMOS or the drive NMOS in a subthreshold region.

In accordance with yet another aspect of the present disclosure, an integrated circuit includes a positive biasing area having a drive PMOS for operating in a subthreshold region and a negative biasing area having a drive NMOS for operating in the subthreshold region. The integrated circuit also includes an input area disposed between and respectively neighboring the positive biasing area and the negative biasing; a first boosting area neighboring the input area and the positive biasing area, the first boosting area including PMOS transistors; and a second boosting area neighboring the input area and the negative biasing area, the second boosting area including NMOS transistors. The integrated circuit also includes a resistive area neighboring the first boosting area and the second boosting area, the resistive area including a resistive element directly connected to the drive PMOS and the drive NMOS.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

What is claimed is:

1. A circuit, comprising:
   a first circuit comprising a PMOS transistor;
   a second circuit comprising an NMOS drive transistor; and
   a third circuit coupled to the PMOS transistor and the NMOS drive transistor,
   wherein:
      the third circuit comprises at least two boosting stages;
      each of the at least two boosting stages comprises matching transistors;
      one or more resistive elements connect the at least two boosting stages;
      the PMOS transistor is a first drive transistor for biasing in a subthreshold region; and
      the NMOS transistor is a second drive transistor for biasing in the subthreshold region.

2. The circuit of claim 1, wherein the matching transistors comprise a pair of PMOS transistors.

3. The circuit of claim 2, wherein the pair of PMOS transistors have the same dimensions.

4. The circuit of claim 3, wherein gates of the pair of PMOS transistors are connected to a first input substage.

5. The circuit of claim 1, wherein the matching transistors comprise a pair of NMOS transistors.

6. The circuit of claim 5, wherein the pair of NMOS transistors have the same dimensions.

7. The circuit of claim 1, wherein the first circuit comprises at least two PMOS transistors connected in parallel to a power node.

8. The circuit of claim 7, wherein the second circuit comprises at least two NMOS transistors connected in parallel to a ground node.

9. The circuit of claim 1, wherein the one or more resistive elements comprise at least one of a MOS transistor or a resistor.

10. A method, comprising:
    configuring at least two transistors of an amplifier circuit for operation in a saturation region, a first of the at least two transistors being connected to a drive PMOS transistor, a second of the at least two transistors being connected to a drive NMOS transistor;
    configuring the drive PMOS transistor and the drive NMOS transistor for operation in a subthreshold region;
    powering the amplifier circuit;
    inputting a signal to a differential input of the amplifier circuit; and
    outputting an amplified signal at an output node of the amplifier circuit.

11. The method of claim 10, wherein the input signal is a clock signal.

12. The method of claim 11, further comprising using the amplified signal as a control signal in a duty cycle corrector.

13. The method of claim 10, wherein at least one or more resistive elements couple the at least two transistors.

14. The method of claim 13, wherein the one or more resistive elements comprise a MOS resistor.

15. The method claim 10, further comprising adjusting drop voltages in the drive PMOS transistor and the drive NMOS transistor to reduce a supply voltage.

16. The method of claim 10, wherein configuring the at least two transistors comprises configuring the drive PMOS transistor in a p-type wide-swing cascade current mirror.

17. The method of claim 16, wherein configuring the at least two transistors comprises configuring the drive NMOS transistor in an n-type wide-swing cascade current mirror.

18. A duty cycle corrector, comprising:
- an input connected to a clock signal;
- a power node;
- a ground node;
- an output node;
- a first circuit connected to the input;
- a second circuit comprising a PMOS transistor, the second circuit being connected to the power node;
- a third circuit comprising an NMOS drive transistor, the third circuit being connected to the ground node; and
- a fourth circuit coupled to the PMOS transistor and the NMOS drive transistor, the fourth circuit being connected to the output node, wherein:
- the third circuit comprises at least two boosting stages;
- each of the at least two boosting stages comprises matching transistors;
- one or more resistive elements connect the at least two boosting stages;
- the matching transistors comprise a pair of PMOS transistors and a pair of NMOS transistors;
- the pair of PMOS transistors have the same dimensions;
- the pair of NMOS transistors have the same dimensions; and
- values of the one or more resistive elements are selected to set a gate voltage of the PMOS transistor and the NMOS transistor for operation in a sub-threshold region.

19. The circuit of claim 1, wherein the one or more resistive elements comprise a resistor connected in series with a transistor.

20. The duty cycle corrector of claim 18, wherein the one or more resistive elements comprise at least one of a resistor, a capacitor, or an inductor.

* * * * *